United States Patent
Hsu et al.

(10) Patent No.: US 6,584,034 B1
(45) Date of Patent: Jun. 24, 2003

(54) FLASH MEMORY ARRAY STRUCTURE SUITABLE FOR MULTIPLE SIMULTANEOUS OPERATIONS

(75) Inventors: Fu-Chang Hsu, San Jose, CA (US); Peter W. Lee, Saratoga, CA (US); Hsing-Ya Tsao, San Jose, CA (US)

(73) Assignee: Aplus Flash Technology Inc., San Jose, CA (US)

( * ) Notice: Subject to any disclaimer, the term of this patent is extended or adjusted under 35 U.S.C. 154(b) by 0 days.

(21) Appl. No.: 10/131,271

(22) Filed: Apr. 23, 2002

Related U.S. Application Data
(60) Provisional application No. 60/285,750, filed on Apr. 23, 2001.

(51) Int. Cl.$^7$ ............... G11C 8/00; G11C 7/00; G11C 7/02
(52) U.S. Cl. ............... 365/230.05; 365/230.03; 365/189.05; 365/214; 365/230.06; 365/189.04
(58) Field of Search ............... 365/230.03, 230.05, 365/230.06, 189.04, 189.05, 214

(56) References Cited

U.S. PATENT DOCUMENTS

| | | | | |
|---|---|---|---|---|
| 4,626,825 A | * | 12/1986 | Burleson et al. | 341/75 |
| 5,109,524 A | * | 4/1992 | Wagner et al. | 712/42 |
| 5,241,510 A | * | 8/1993 | Kobayashi et al. | 365/230.03 |
| 5,249,165 A | * | 9/1993 | Toda | 365/189.04 |
| 5,502,683 A | * | 3/1996 | Marchioro | 365/230.05 |
| 5,581,508 A | * | 12/1996 | Sasaki et al. | 365/200 |
| 5,687,121 A | * | 11/1997 | Lee et al. | 365/185.11 |
| 5,748,538 A | * | 5/1998 | Lee et al. | 365/185.06 |
| 5,841,696 A | | 11/1998 | Chen et al. | 365/185.11 |
| 5,847,998 A | | 12/1998 | Van Buskirk | 365/185.33 |
| 5,867,430 A | | 2/1999 | Chen et al. | 365/189.04 |
| 5,877,976 A | * | 3/1999 | Lattimore et al. | 365/63 |
| 5,917,757 A | * | 6/1999 | Lee et al. | 365/185.33 |
| 6,033,955 A | | 3/2000 | Kuo et al. | 438/257 |
| 6,052,327 A | | 4/2000 | Reddy et al. | 365/230.05 |
| 6,088,264 A | | 7/2000 | Hazen et al. | 365/185.11 |
| 6,240,040 B1 | | 5/2001 | Akaogi et al. | 365/230.06 |
| 6,243,293 B1 | * | 6/2001 | Van Houdt et al. | 365/185.14 |
| 6,462,986 B1 | * | 10/2002 | Khan | 365/185.2 |
| 2002/0176286 A1 | * | 11/2002 | Bergemont et al. | 365/200 |

FOREIGN PATENT DOCUMENTS

JP 07327136 A * 12/1995 ............. H04N/1/46

* cited by examiner

*Primary Examiner*—Hoai Ho
*Assistant Examiner*—Ly Duy Pham
(74) *Attorney, Agent, or Firm*—George O. Saile; Stephen B. Ackerman

(57) ABSTRACT

In the present invention is disclosed a flash memory for simultaneous read and write operations. The memory is partitioned into a plurality of sectors each of which have a sector decoder. The sector decoder connects a plurality of main bit lines to a plurality of sub bit lines contained within each memory sector A $2^1$ decoder is used to demonstrate the invention although other decoders including a $2^M$ decoder and a hierarchical type decoder can be used. The memory array can be configured from a variety of architectures, including NOR, OR, NAND, AND, Dual-String and DINOR. The memory cells can be formed from a variety of array structures including ETOX, FLOTOX, EPROM, EEPROM, Split-Gate, and PMOS.

11 Claims, 22 Drawing Sheets

FLASH MEMORY ARRAY STRUCTURE SUITABLE FOR MULTIPLE SIMULTANEOUS OPERATIONS

The instant application claims priority to U.S. Provisional Application Ser. No. 60/285,750, filed Apr. 23, 2001, which is herein incorporated by reference.

BACKGROUND OF THE INVENTION

1. Field of the Invention

The present invention relates to semiconductor flash memory, and more particularly to multiple simultaneous read and write operations on a flash memory.

2. Description of the Related Art

Non-volatile memories, especially flash memories, are widely used in various applications such as computers, hand-held devices, communication devices and consumer products. Since a flash memory is nonvolatile and permits an on system electronic programmability, the flash memory is suitable to store the program code and data code for microprocessors. Flash memory has become widely used in storage for voice data and video data; however, flash memory has a significant drawback in that it requires a relatively long time to process a write operation. It typically takes several milliseconds to several seconds to write data. During this time period, the data stored in the memory cannot be read causing inconvenience of operation. Therefore, a simultaneous operating flash memory is used to fulfill this requirement. The simultaneous operating flash memory allows data to be read out when the memory is performing the write operation. In conventional simultaneous operating flash memories there are two individual banks having fixed memory density. Each bank can independently perform read and write operations, and therefore, the data stored in one bank can be read while the other bank is performing the write operation. There are two significant drawbacks to this prior art configuration: 1) It lacks of flexibility for the memory density of each bank. The density of each bank is determined in the design step, and cannot be altered after manufacturing. 2) The bank size is large. When new data is written into one bank, the other data stored in the bank being written cannot be read.

In order to overcome these problems, some of the prior art increases the flexibility of the array partition and make smaller array partitions creating a different set of drawbacks. To better understand the basic operations of flash memories the read operation is defined as reading stored data from selected memory cells, and the write operation is defined as all the operations involved in changing the data stored in selected cells. A write operation generally includes several operations: 1) An erase operation that is used to remove the previous old data from selected memory cells. 2) A program operation that is used to store new data into selected memory cells. 3) A preprogram operation that is used to increase the Vt of the selected cells before the erase operation. 4) A correct, repair, soft program, or converge operation that is used to make the Vt of over erased cells to be in an allowable range. 5) A de-trap operation that is used to remove the hot hole trapped inside the tunnel oxide after the erase or program operations. All of these operations are a part of a write operation. The required operations vary for different flash memories. Some flash memories require fewer operations while-others require all of the operations. Also different types of flash memory cells, technologies, and array architectures, generally require different bias conditions and operation timing.

In U.S. Pat. No. 6,088,264 (Hazen et al.) a method is directed to divide flash memory array into several partitions as shown in FIG. 1A. Each array partition 210 has its own X decoder 220 and y decoder 230. This makes each array partition into a mini array. Each array partition can perform a write or read operation independently and simultaneously with the other partitions. This approach is the extension of the conventional simultaneous flash memories, except that it utilizes more than two banks. Because more than two partitions are used, a smaller partition size can be achieved having more flexible operations. However, the prior art of U.S. Pat. No. 6,088,264 has several drawbacks: 1) A separate y decoder for each array partition which causes an area penalty. 2) The array partition is fixed in size. 3) The array partition is large. 4) The common data lines connected to the y decoder of each array partition have large parasitic load capacitance that can cause significant read delay for the sense amplifiers.

To overcome the problems associated to the prior art of FIG. 1A, U.S. Pat. No. 6,033,955 (Kuo et al.) discloses another approach shown in FIG. 1B, which is directed to change the size of the partition. The prior art of FIG. 1B divides the flash memory array 20 into two partitions, called upper bank 22 and lower bank 21. Each bank has its own y decoders 32 and 34, one located on the top of the array and the other one located on the bottom of the array. The prior art of FIG. 1B is directed toward using a metal bit line option during the manufacturing to alter the boundary between the upper bank and the lower bank. This allows the size of the two partitions to be altered, while the total size of the two partitions keep constant. However, there are several drawbacks to the prior art of FIG. 1B: 1) An array can be only partitioned into two partitions. 2) The flexible boundary of the two array partitions has to be decided in a manufacturing step, and cannot be altered after manufacturing. 3) Although one array partition can be small size, the other one will become very large size.

In U.S. Pat. No. 6,240,040 B1 (Akaogi et al.) an architecture is directed to address buffering and decoding for a multiple bank simultaneous operating flash memory. U.S. Pat. No. 6,052,327 (Reddy et al.) is directed to a dual port memory array for a logic device where data words may be read and written simultaneously. In U.S. Pat. No. 5,867,430 (Chen et al.) a flash memory device is directed to multiple banks each with a decoder and a plurality of sectors to allow simultaneous read and write operations. U.S. Pat. No. 5,847,998 is directed to a nonvolatile memory array that has a plurality of sectors with independent read and write paths which permit reading from one sector while writing to a second sector. U.S. Pat. No. 5,841,696 is directed to a nonvolatile memory which allows simultaneous read and write operations using time multiplexing of an x-decode path between read and write operations.

SUMMARY OF THE INVENTION

An objective of the present invention is to provide a flash memory with multiple simultaneous operations that overcomes the drawbacks of the simultaneous operating flash memories of the prior art.

Another objective of the present invention is to provide a new approach that can fully produce a simultaneously read and write operation of a non-volatile memory.

Still another objective of the present invention is to provide smaller array partition.

A further objective of the present invention is to provide a flexible array partition.

Still a further objective of the present invention is to provide an array that contains at least two or more sectors where each sector has an associated sector decoder.

Also a further objective of the present invention is to provide main bit lines that are divided into at least two or more groups, where each group of bit lines can perform different operations separately.

Also a still further objective of the present invention is to provide a sector decoder that has at least two output ports to connect the main bit line groups to sub bit lines.

The present invention is related to the array architecture of non-volatile memories, especially flash memories. Its application is broad and is not limited in any special type of flash memory. The basic concept of the present invention can be utilized for any type of array structure, comprising such structures as NOR, NAND, AND, OR, Dual-String, and DINOR. Moreover, the basic concept of the present invention can be utilized for any type of memory cells, comprising such cells as ETOX, FLOTOX, EPROM, EEPROM, Split-gate and PMOS. Three embodiments of array architectures will be demonstrated that use typical NOR, AND, and NAND array structures. Although, the present invention can utilize a $2^M$ sector decoder, the demonstration of the present invention applied to various array structures will use a $2^1$ sector decoder for ease of understanding. A $2^M$ decoder couples one input to any one of $2^M$ outputs, and a $2^1$ sector decoder will provide a dual-port operation. The demonstration herein of the operation of the dual ports will be one "program" operation and one "read" operation and will show the array architecture performing simultaneously read and write operations in two sectors. It should be understood that the simultaneous operation can include any combination of read and write operations and any other memory operations requiring the use of bit lines and word lines and the associated decoders.

BRIEF DESCRIPTION OF THE FIGURES

This invention will be described with reference to the accompanying drawings, wherein.

DETAILED DESCRIPTION OF THE PREFERRED EMBODIMENT

Figure 1A:
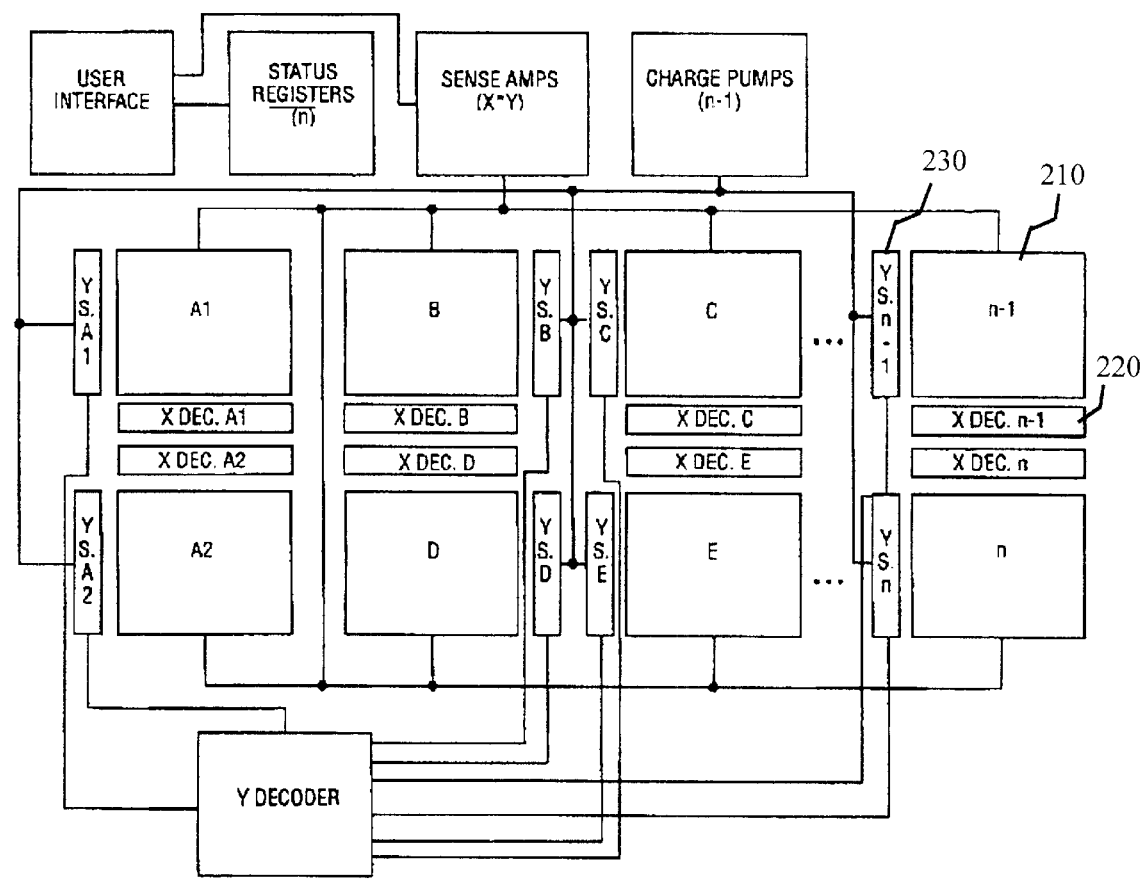
FIG. 1A is a block diagram of prior art showing a partitioned memory having simultaneous read and write capability.
Figure 1B:
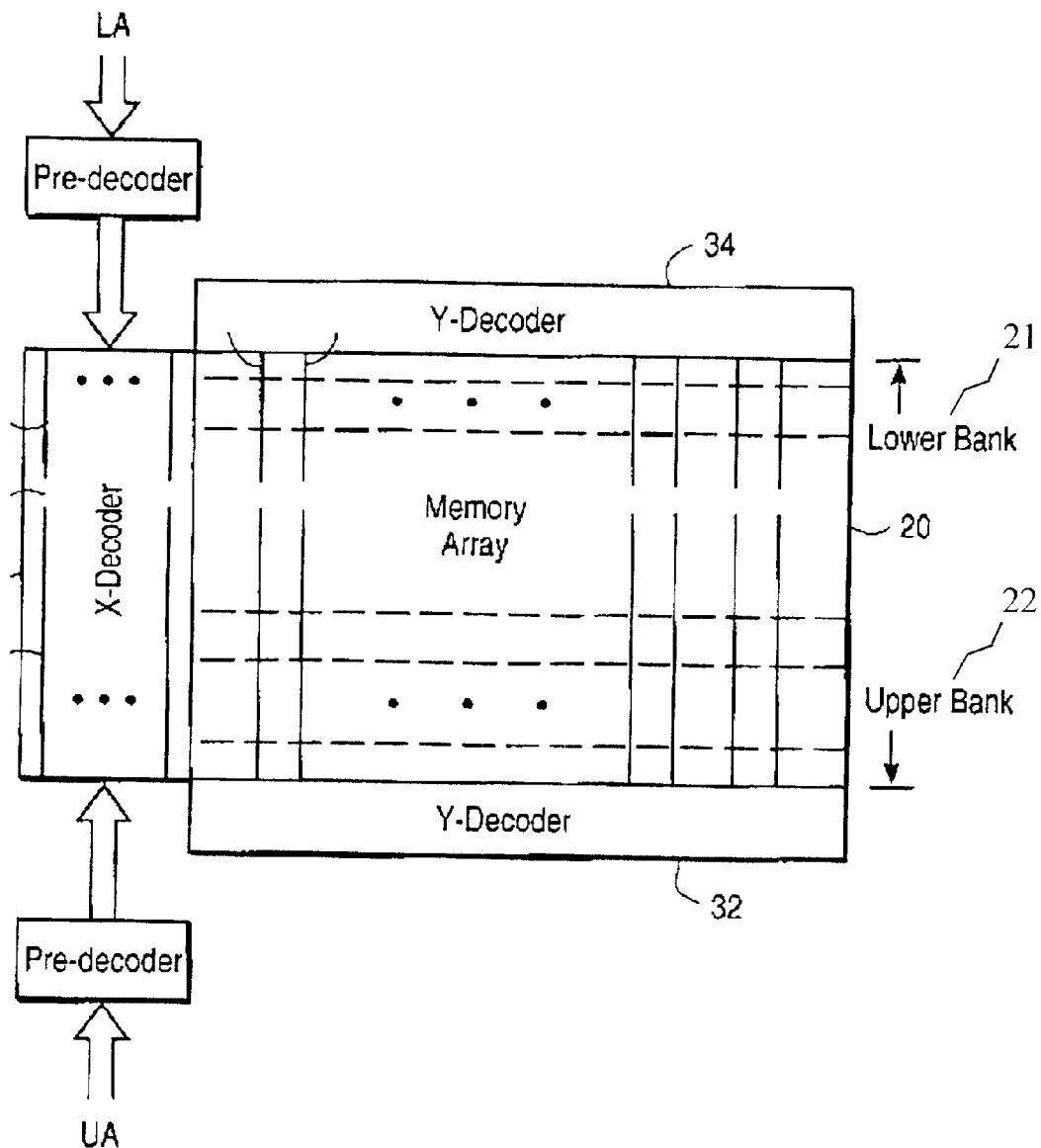
FIG. 1B is a block diagram of a second prior art showing a partitioned memory having capability to perform simultaneous read and write operations.
Figure 2:
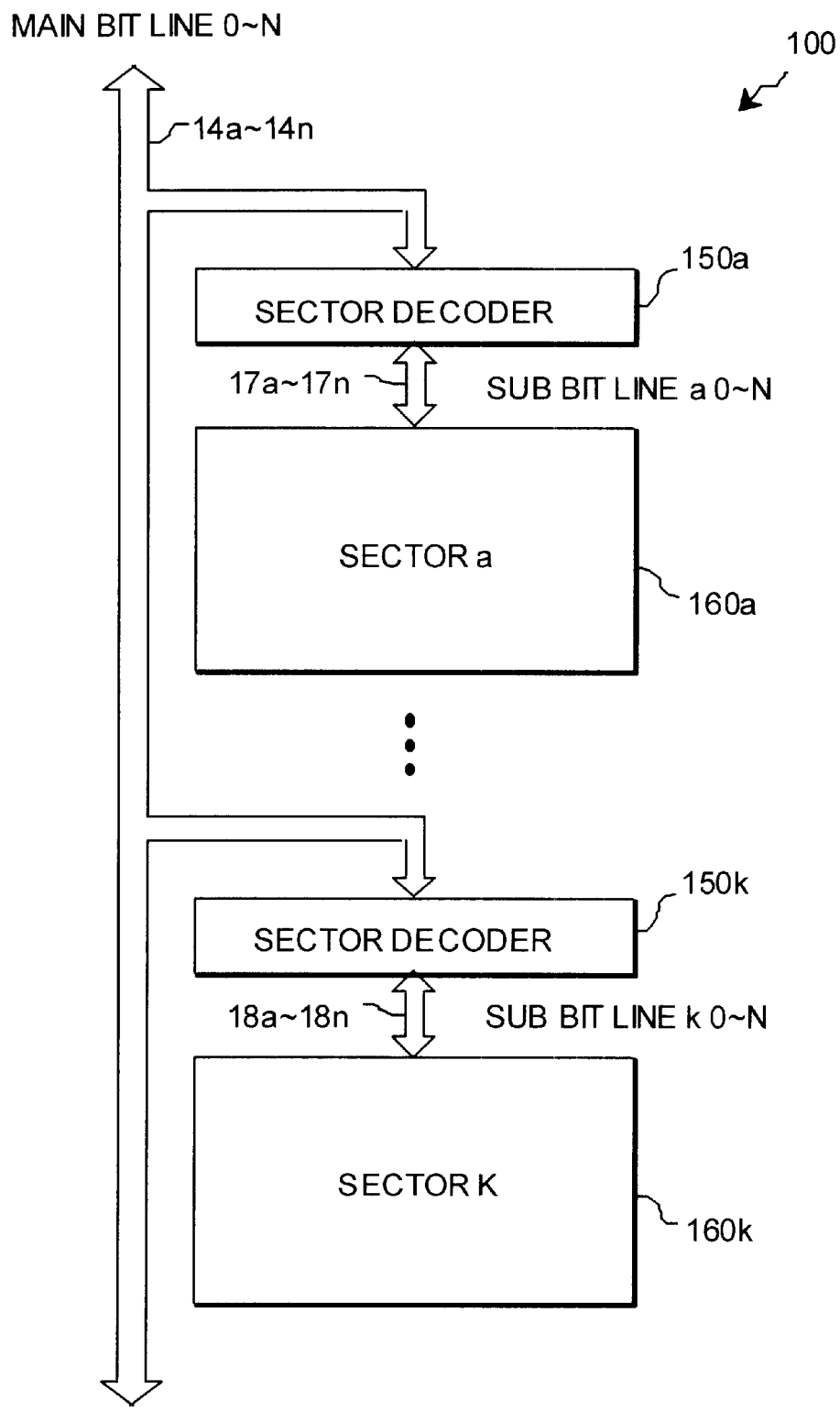
FIG. 2 is a diagram of prior art showing a conventional flash memory array architecture.

For comparison purposes a discussion will be made referring to the conventional array architecture of flash memories, as shown in FIG. 2. The conventional flash memory array or FIG. 2 is divided into several sectors (160a–160k). Each sector contains several sub bit lines 0-N (17a–17n). Each sector has an associated sector decoder (150a–150k). The output of the sector decoders are connected to the main bit lines 0-N (14a–14n). When a sector is selected, its associated sector decoder will connect the sub bit lines 0-N to the main bit lines 0-N 14a–14n. This array architecture is widely used in various kinds of the flash memories due to a problem for disturb conditions resulting from shared word lines and shared bit lines.

Continuing to refer to FIG. 2, in order to overcome the disturb problem, the flash memories are typically erased in a block or sector size. A typical sector size for flash memories is 64 k bytes or more. Using the sector architecture during the erase or program operation, a high voltage is applied to the selected sector only, and the data stored in the sector is erased and programmed together. The sector decoder allows the high voltage to be applied only to the selected sectors; therefore, the data stored in other sectors will not be disturbed. The high voltage disturb condition will not be accumulated, and the disturb problem is minimized.

Continuing to refer to FIG. 2, although, the erase operation is performed in a sector, a read or write operation is not allowed to be done simultaneously. For the conventional flash memory, once there is one sector in a write operation, a read or write operation cannot be performed in other sectors. This is because the main bit lines 0-N 14a–14n of a conventional flash memory are allowed only a single port operation. Since the main bit lines are shared for all the sectors, they are used to provide high voltages to the selected sector for a write operation, and cannot be used to connect to any other sector. This limits the array operation to only one sector that can be selected to perform a single operation. For example, when the sector 160*a* is selected for a write operation the sub bit lines 17*a*–17*n* are connected to the main bit lines 14*a*–14*n*. The high voltages are then applied from the main bit lines 14*a*–14*n* to the sub bit lines 17*a*–17*n* to perform a write operation. All sub bit lines 18*a*–18*n* in the other deselected sectors 160*k* will not be able to be read or written because the main bit lines 14*a*–14*n* have been occupied by the selected sector 160*a*. This limits the operation of the conventional Flash memories to single port operation.

Continuing to refer to FIG. 2 when the sub bit lines 17*a*–17*n* are selected for the write operation, the sector decoder 160*a* is selectively turned on and connects the sub bit lines 17*a*–17*n* to the main bit lines 14*a*–14*n*. This allows the main bit lines 14*a*–14*n* to provide the selected sub bit lines 17*a*–17*n* with the voltages according to the required bias condition for the write operation. The array architecture does not provide the sub bit lines with multiple port access capability, and the main bit lines 14*a*–14*n* will be tied to the sub bit lines 17*a*–17*n* for the write operation.

Figure 3:
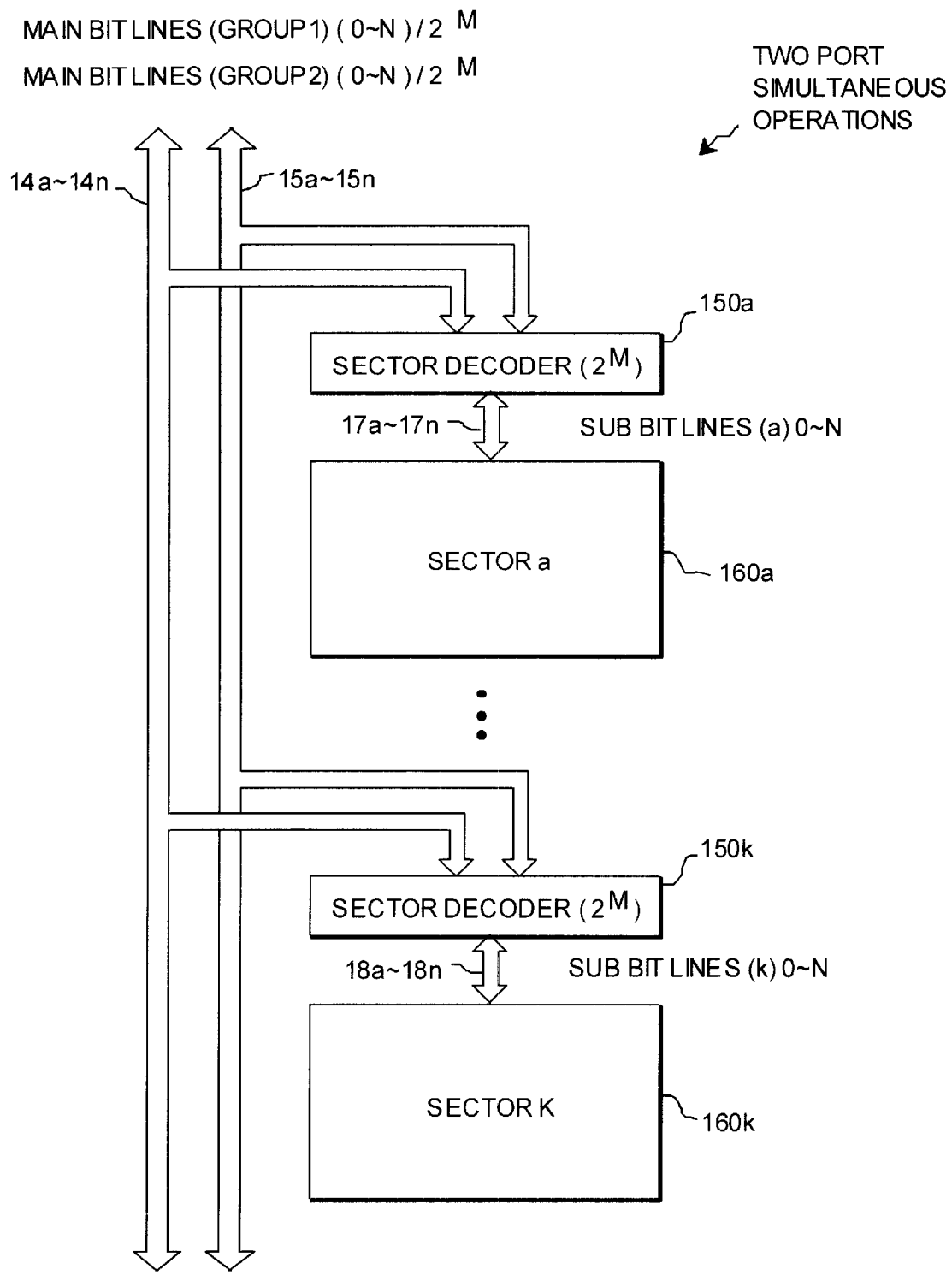
FIG. 3 is an architectural diagram of the present invention for two port simultaneous operations of a flash memory.

Referring to FIG. 3, to overcome the drawback of the conventional flash memory, the present invention discloses a new array architecture that is suitable for multi-port operation. Unlike the conventional flash memory array, the main bit lines are separated into two groups 14*a*–14*n* and 15*a*–15*n*. Each group contains several main bit lines 0-N. Both the main bit line groups 14*a*–14*n* and 15*a*–15*b* are connected to the sector decoders 150*a*–150*k*. The sector decoders 150*a*–150*k* have a dual-port input function that allows, for instance, the sub bit lines 17*a*–17*n* of a sector 160*a* to connect to either main bit line groups 14*a*–14*n* or 15*a*–15*n*. The sector decoder 150*a*–150*k* of each sector can be independently selected to connect the sub bit lines in any selected sector 160*a*–160*k* to the two main bit line groups 14*a*–14*n* or 15*a*–15*n*.

Continuing to refer to FIG. 3, the sector decoder 150*a*, for example, can select the sub bit lines 17*a*–17*n* of the sector 160*a* to be connected to the first group of main bit lines 14*a*–14*n*. At the same time the sector decoder 150*k* can select the sub bit lines 18*a*–18*n* of the sector 160*k* to be connected to the second group of main bit lines 15*a*–15*n*. Since the selected sub bit lines 17*a*–17*n* and 18*a*–18*n* are connected to different main bit line groups 14*a*–14*n* and 15*a*–15*n*, the sub bit lines 17*a*–17*n* and 18*a*–18*n* can perform different memory operations simultaneously. For example, the first group of the main bit lines 14*a*–14*n* can be used to perform the write operation while the second group of main bit lines 15*a*–15*n* is used to perform a read operation.

Figure 4:
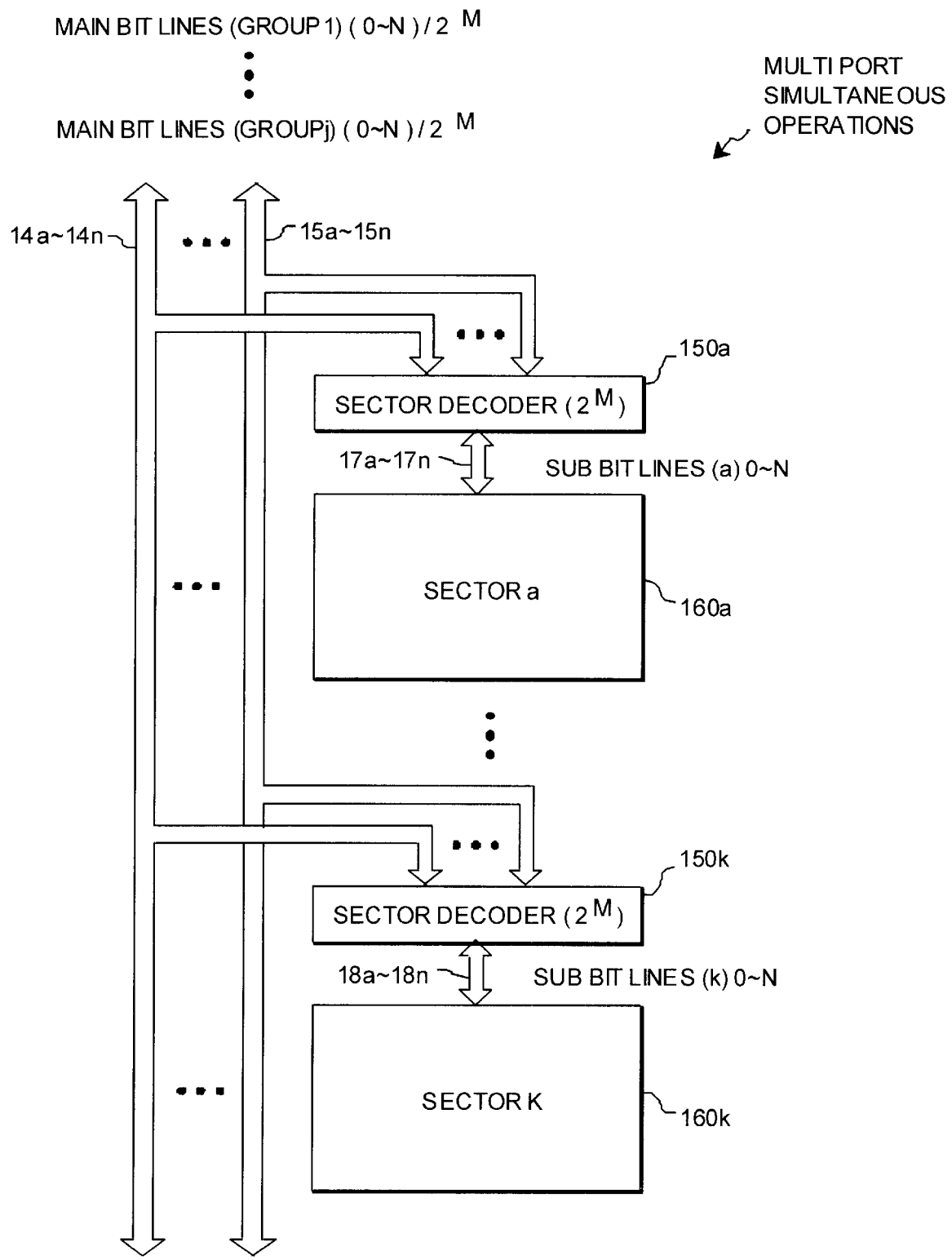
FIG. 4 is an architectural diagram of the present invention for a multi-port simultaneous operation of a flash memory.

Referring to FIG. 4, an array architecture suitable for multiple-port operation is shown. The main bit lines are divided into multiple groups 14*a*–14*n* to 15*a*–15*n*. Similar to the dual-port operation shown in FIG. 3, multiple sectors 160*a*–160*k* can be independently selected by the sector decoders 150*a*–150*k* and connected to the main bit lines groups 14*a*–14*n* to 15*a*–15*n*. Under the control of the main bit lines, each sector can perform different memory operations simultaneously.

Figure 5:
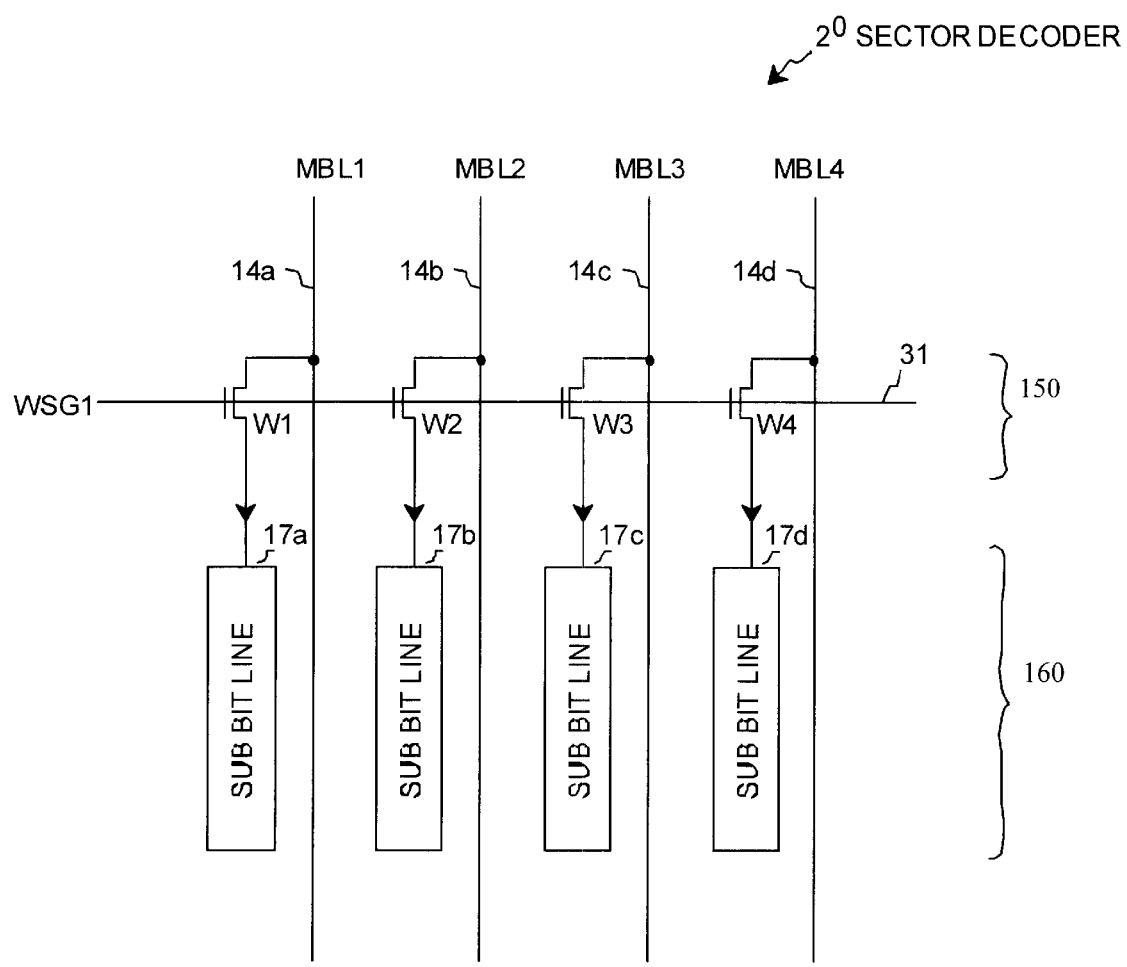
FIG. 5 is a diagram of prior art showing a decoder design of a conventional Flash memory.

It should be noted that although the main bit lines are separated into two groups, the number of the main bit lines is not necessarily doubled in the implementation. Using different sector decoder scheme can alter the number of the main bit lines. For example, FIG. 5 shows a decoder 160 and a sector decoder 150 of a conventional flash memory. The sector decoder uses the $2^0$ decoding scheme which means the decoder inputs and outputs are one-to-one. For this type of sector decoder, the decoder becomes a simple pass-gate function and the number of main bit lines 14*a*–14*d* will be equal to the number of the sub bit lines 17*a*–17*d*.

Figure 6:
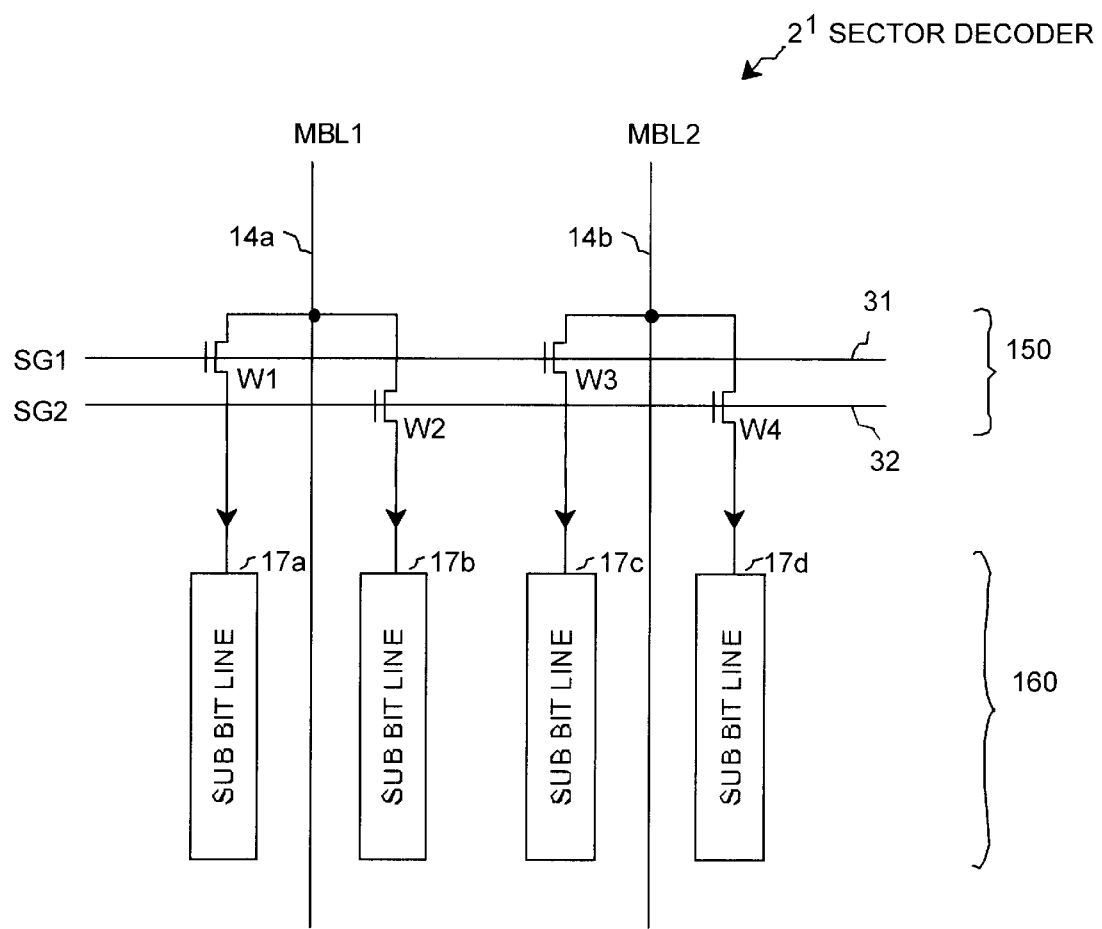
FIG. 6 is a diagram of prior art showing a second decoder design of a conventional Flash memory.

FIG. 6 shows another sector decoder for a convention flash memory array that uses the $2^1$ sector decoder scheme. In this decoder scheme, the relationship between the inputs of the outputs is one-to-two. That means, each main bit line can be decoded and connected to one of two sub bit lines. Therefore, the number of the main bit lines will be only half of the sub bit lines. Both the decoder schemes shown in FIG. 5 and FIG. 6 are commonly used in the conventional flash memories. Choosing the sector decoder scheme is a design consideration and is based on the trade off between the number of the main bit lines and the select gate control lines 31 and 32. The higher the number M in the $2^M$ decoder that is used, the less the number of main bit lines that are needed, but the greater the number of the select gate control lines 31 and 32 that have to be used. However, since each sub bit line 17*a*–17*d* typically contains a number of memory cells (e.g. 128 or 512), the area penalty increase caused by the extra select gate control lines 31 and 32 is relatively small compared to the area of the sub bit lines. Using at least a $2^1$ decoder scheme is generally valuable for the flash memories that use more advanced fabrication technology and the main bit line pitch becomes a concern.

Referring back to the array architecture for the present invention shown in FIG. 3, the total number of the main bit lines 14*a*–14*n* and 15*a*–15*n* will become twice that of the sub bit lines when using the $2^1$ sector decoder. However, the number of the main bit lines can be equal to the number of the sub bit lines when using the $2^1$ sector decoder. Also, the number of the main bit lines can be divided by factor of M if a $2^M$ sector decoder is utilized. Therefore, the number of the main bit lines can be optimized in terms of the main bit line pitch and the sector decoder size. The basic concept of the present invention is not limited to a dual-port operation only and can be used for any number of multiple-port operations.

Figure 7:
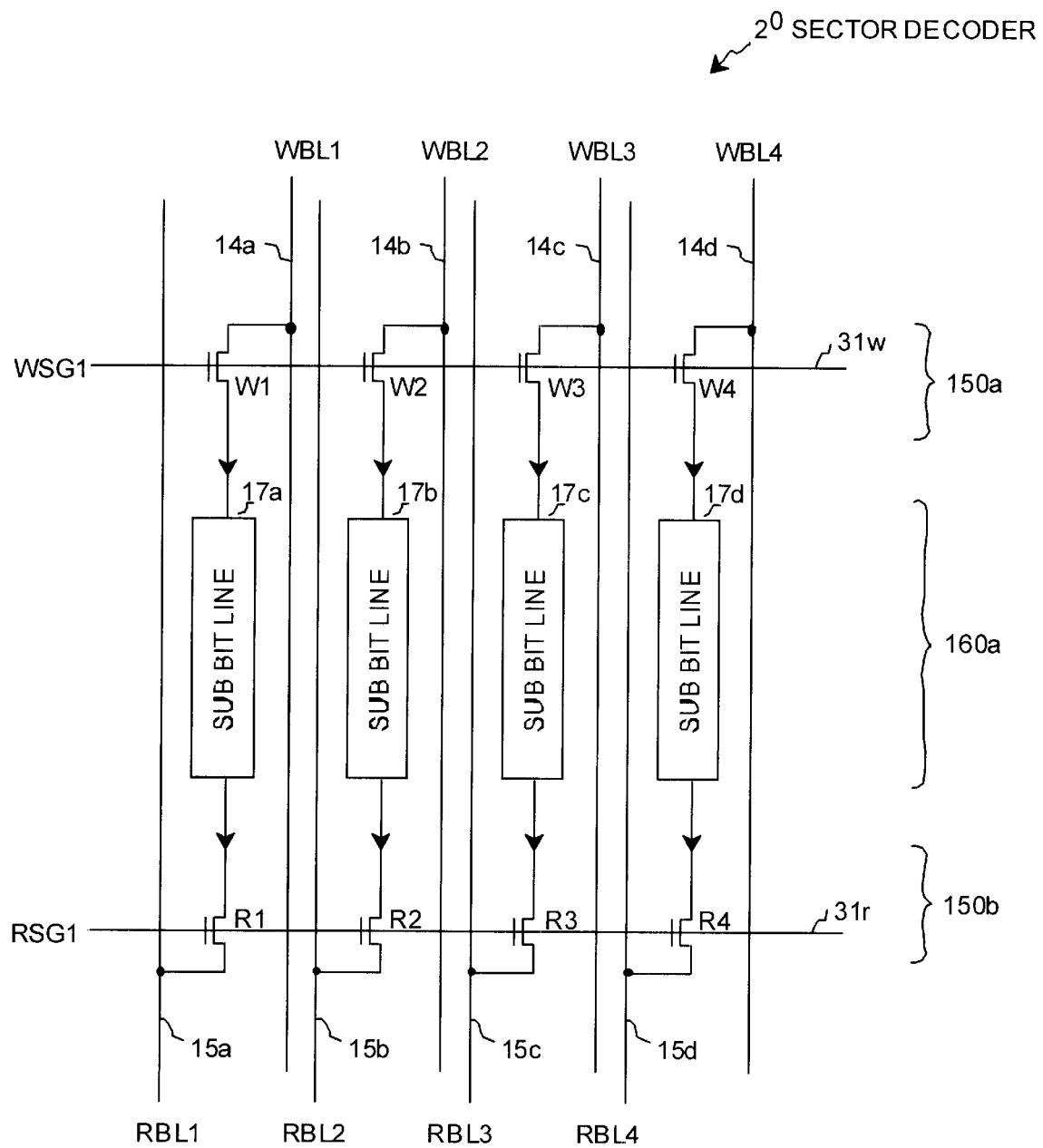
FIG. 7 is a diagram showing a $2^0$ sector decoder of the present invention.

Referring to FIG. 7, shown is a sector 160*a* of the present invention that contains several sub bit lines 17*a*–17*d*. The main bit lines are divided into two groups 14*a*–14*d* and 15*a*–15*d*. The sector decoder has a dual-port output function and contains two output ports 150*a* and 150*b*. The first output port 150*a* contains several transistors W1–W4 that are used to select the sub bit lines 17*a*–17*d* and connect them to the first group of the main bit lines 14*a*–14*d*. The second output port 150*b* contains several transistors R1–R4 and is used to select the sub bit lines 17*a*–17*d* and connect them to the second group of the main bit lines 15*a*–15*d*. The array architecture shown in FIG. 7 allows the two groups of the main bit lines 14*a*–14*d* and 15*a*–15*d*) to connect to sub bit lines in two different sectors by turning on the sector decoder 150*a* and 150*b*. Thus, two different operations, such as read and write, can be performed in these two sectors simultaneously. Because the sub bit lines 17*a*–17*b* of the conventional flash memory of prior art have only one output port for the sector decoder 150, the main bit lines 14*a*–14*d* can be connected to the sub bit lines 17*a*–17*d* of only one sector and can perform only one operation at one time. The example of the present invention shown in FIG. 7 uses the $2^0$ sector decoder scheme; therefore, the number of the total main bit lines 14*a*–14*d* and 15*a*–15*d* are twice of the number of the sub bit lines 17*a*–17*d* in each sector.

Figure 8:
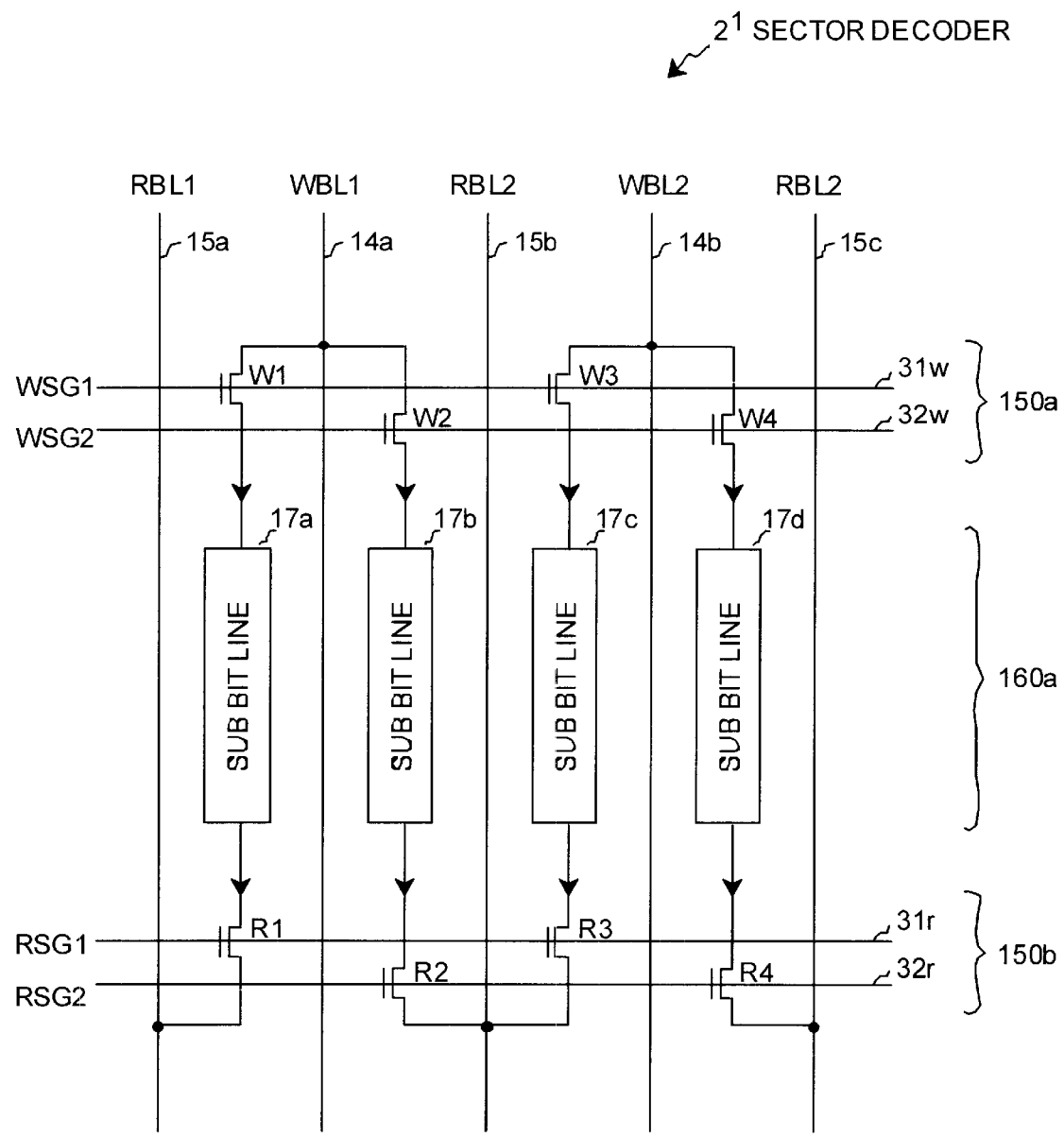
FIG. 8 is a diagram of the present invention showing a $2^1$ sector decoder scheme.

Shown in FIG. 8 is another embodiment of the present invention that uses the $2^1$ sector decoder scheme. In the $2^1$ decoder scheme, one main bit line can be connected to two sub bit lines through selection by the sector decoder. As a result, the number of the total main bit lines 14a–14d and 15a–15d is the same as the sub bit lines 17a–17d. This configuration is compatible with today's most advanced manufacturing technology, because the pitch of the main bit line that is made by a metal layer is approximately equal to the cell pitch. The operation of this embodiment is very similar to the previous embodiment shown in FIG. 7. To accomplish the embodiment shown in FIG. 8, the sector decoder must have two output ports 150a and 150b. The first output port 150a contains several transistors W1–W4 that can selectively connect the sub bit lines 17a–17d to the first main bit line group 14a–14d. The second output port 150b contains several transistors R1–R4 that can selectively connect the sub bit lines 17a–17d to the second main bit line group 15a–15d. Thus, the sub bit lines in two different sectors can be selected and connected to the first and the second main bit lines group to perform two different memory operations simultaneously, such as read and write.

Figure 9:
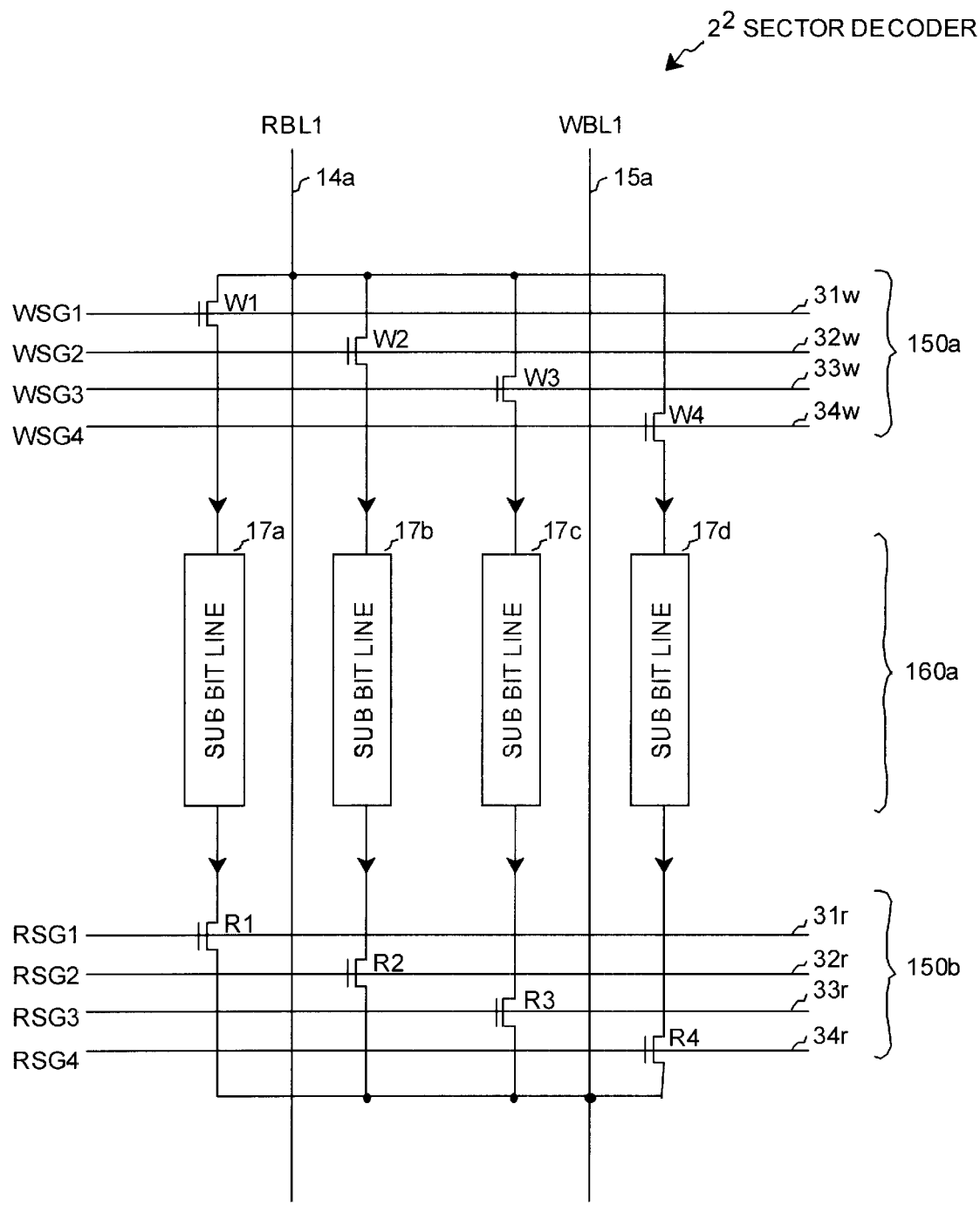
FIG. 9 is a diagram of the present invention showing a $2^2$ sector decoder scheme.

FIG. 9 shows a third embodiment of the present invention. This embodiment contains the same features for the dual-port operation as the previous embodiments, comprising dual-output-port sector decoders 150a and 150b, two main bit line groups 14a and 15a. Therefore, this embodiment can simultaneously perform two different memory operations in two different sectors. The main difference between the embodiment shown in FIG. 9 and the other embodiments shown in FIG. 7 and 8 comprises the use of the $2^2$ sector decoder. This allows one main bit line, 14a or 15a, to be decoded and connected to four sub-bit lines 17a–17d which reduces the number of the main bit lines to one fourth of the sub bit lines.

In embodiments of the present invention array architecture shown in FIGS. 7, 8 and 9 uses $2^0$, $2^1$, and $2^2$ sector decoder schemes. It should be noted that the sector decoder can be any $2^M$ decoder with M being any number. The number M is a design factor, which determines the number of the main bit lines. It should also be noted that, although, $2^M$ decoders are use herein to describe the present invention, the present invention can also be realized with any other type of decoder. The less frequently used "odd" number decoder can be also used to decode 3, 5, or 7 number of sub bit lines to one main bit line. Also, the invention can be realized by using any type of sector decoders not mentioned in the embodiments of the present invention. Although the embodiments of the present invention were described with array architectures providing dual port operations, the array architecture can be modified to provide multiple-port operations using the concept of the present invention shown in FIG. 4.

Figure 10:
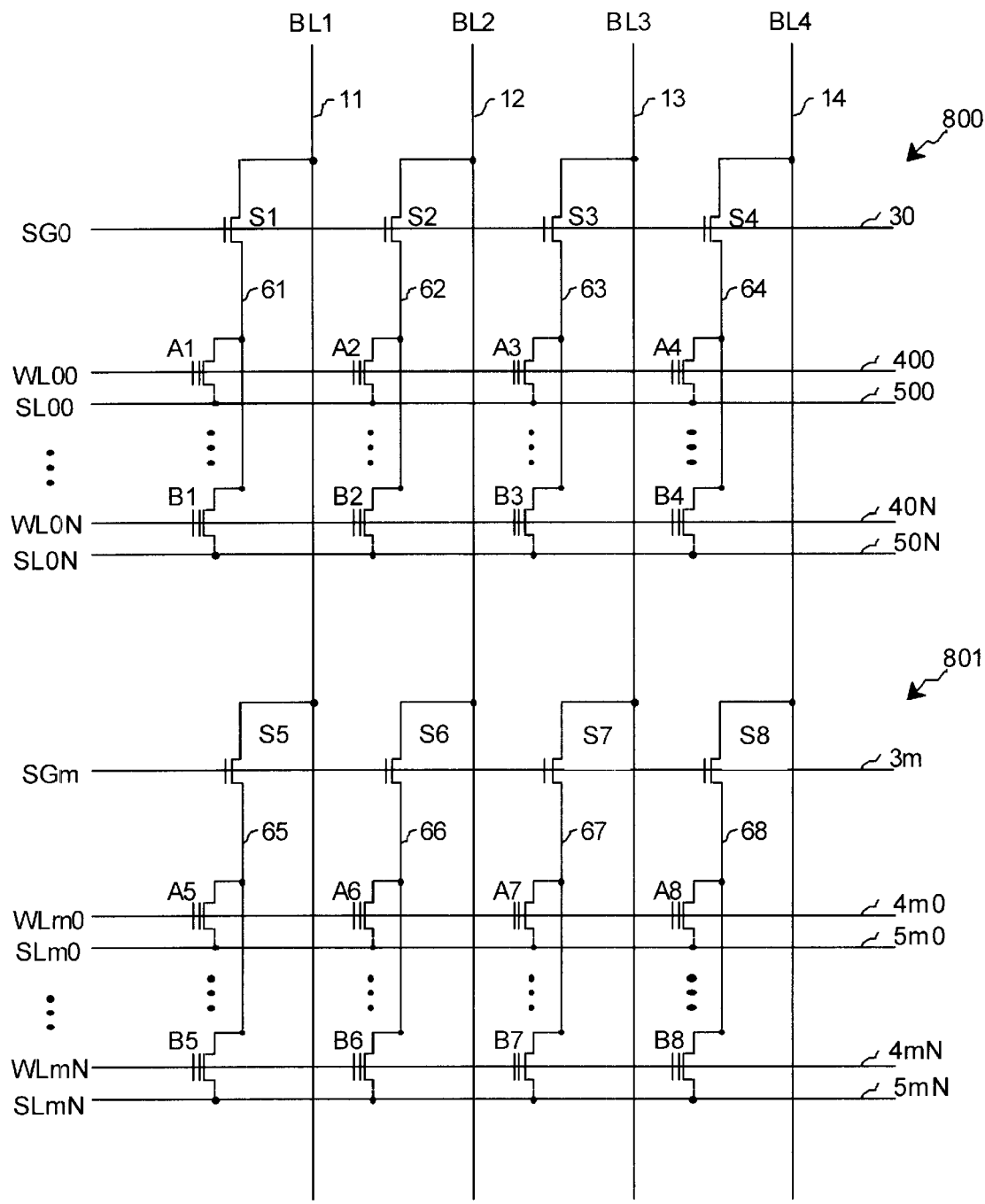
FIG. 10 is a diagram of prior art showing a NOT type array.

In FIG. 10 is shown a portion of a non-volatile NOR type memory array of prior art. The array is organized into sectors 800 and 801. Main bit lines BL1–BL4 (11, 12, 13 and 14) connect to sectors including sectors 800 and 801. Each sector has a sector gate line as represented by sector gate lines SG0 (30) connecting to transistors S1–S4 and SGm (3m) connecting to transistors S5–S8. In the first sector 800 word lines WL00–WL0N (400–40N) and source lines SL00–SL0N (500–50N) connect to flash memory cells A1–A4 and B1–B4. Sub bit lines 61–64 are connected to the main bit lines 11–14 by sector gates S1–S4. In the second sector 801 word lines WLm0–WLmN (4m0–4mN) and source lines SLm0–SLmN (5m0–5mN) connect to flash memory cells A5–A8 and B5–B8. Sub bit lines 65–68 are connected to the main bit lines 11–14 by sector gates S5–S8. The memory array shown in FIG. 10 is capable of performing only one memory operation at a time.

Figure 11:
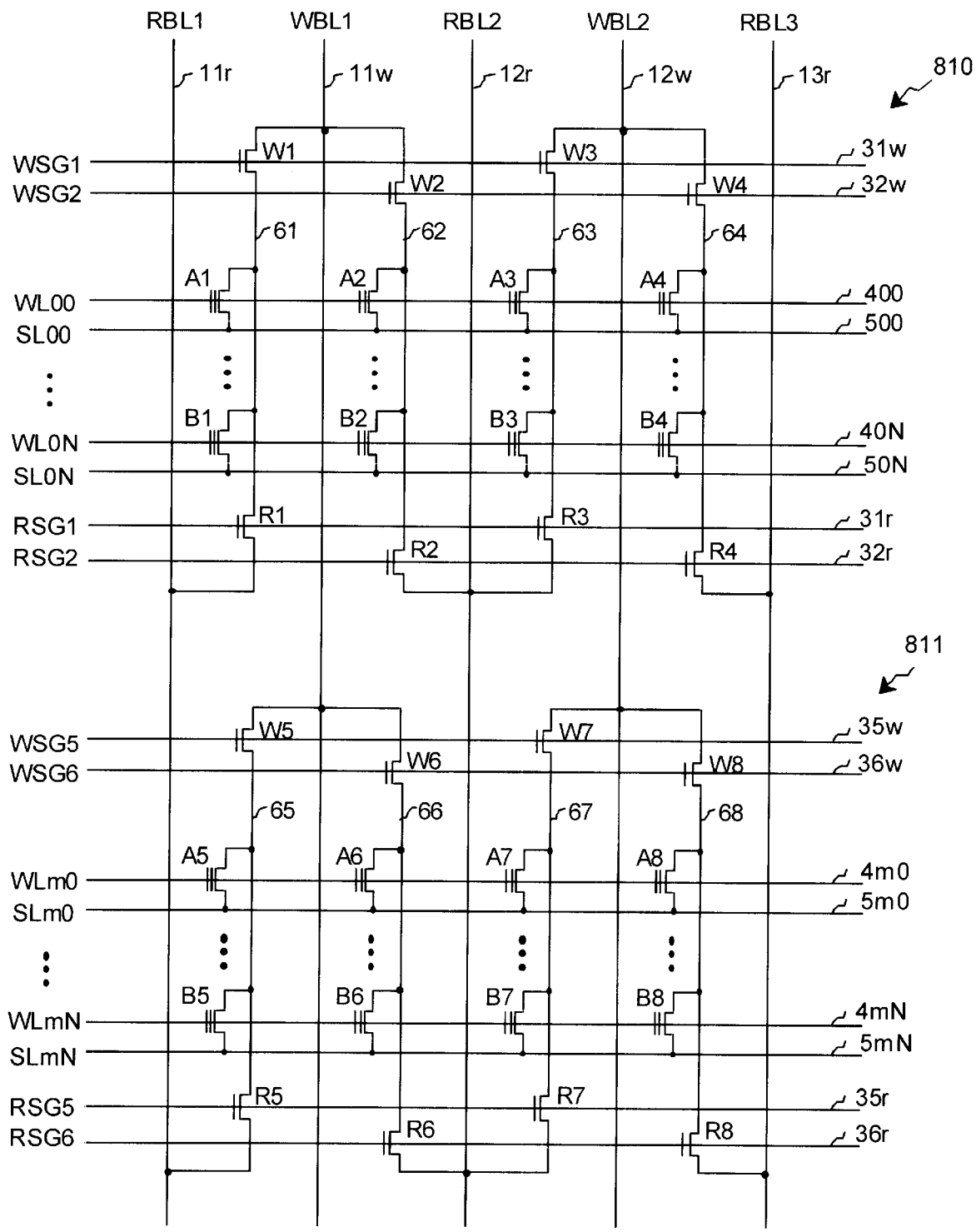
FIG. 11 is a diagram showing a NOR type array of the present invention.

FIG. 11 shows a NOR type flash memory array of the first embodiment of the present invention. Two sectors 810 and 811 of the memory array are shown, which uses a two port sector decoder (not shown) along with two main bit line groups RBL1–RBL3 and WBL1–WBL2 to provide simultaneous memory operations. The memory cells A1–A4 and B1–B4 in the first sector 810 are connected to sub bit lines 61–64, and the memory cells A5–A8 and B5–B8 in the second sector 811 are connected to sub bit lines 65–68. The array cells A1–A4 through B1–B4 are connected to word lines WL00–WL0N (400–40N) and source lines SL00–SL0N (500–50N). The sector decoder drives sector gates W1 and W3 at the top of the sector 810 through selector gate line WSG1 (31w) and sector gates W2 and W4 through sector gate line WSG2 to select main bit lines WBL1 (11w) and WBL2 (12w) for a write operation. The sector decoder drives sector gates R1 and R3 at the bottom of the array through selector gate line RSG1 (31r) and sector gates R2 and R4 through sector gate line RSG2 to select main bit lines RBL1 (11r), RBL2 (12r) and RBL2 (12r) for a read operation.

Continuing to refer to FIG. 11, the array cells A5–A8 through B5–B8 are connected to word lines WLm0–WLmN (4m0–4mN) and source lines SLm0–SLmN (5m0–5mN). The sector decoder drives sector gates W5 and W7 at the top of the sector 811 through selector gate line WSG5 (35w) and sector gates W6 and W8 through sector gate line WSG6 to select main bit lines WBL1 (11w) and WBL2 (12w) for a write operation. The sector decoder drives sector gates R5 and R7 at the bottom of the array through selector gate line RSG5 (35r) and sector gates R6 and R8 through sector gate line RSG6 to select main bit lines RBL1 (11r), RBL2 (12r) and RBL2 (12r) for a read operation. The dual port arrangement of the array shown in FIG. 11 allows two memory operations to be performed simultaneously.

Figure 12:
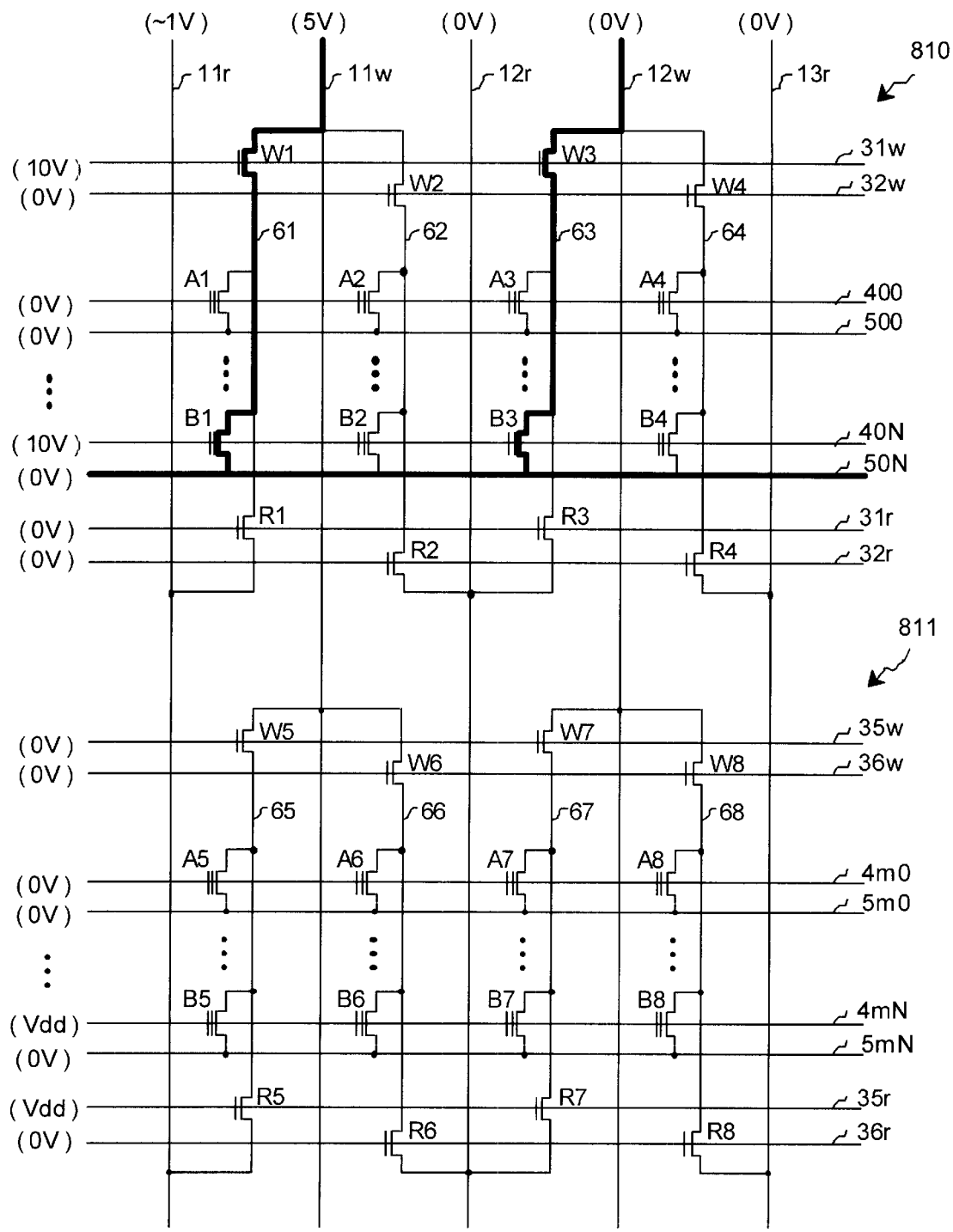
FIG. 12 is a diagram of the present invention showing bias conditions to program a first sector of a NOR type array while reading a second sector.

FIG. 12 shows an example of bias conditions of the present invention for a NOR type array to setup programming of the first sector 810 while the second sector 811 is simultaneously read. The bold lines shows the voltages applied to the selected sub bit lines in the first sector 810 to perform a program operation. The sector decoder applies +10V to the sector gates W1 and W3 through the selector gate line 31w. This connects the +5V on the main bit line 11w to the sub bit line 61. The word line 40N is biased with +10V to activate memory cell B1, and 0V is applied to the source gate line 50N to complete the electrical path and allow cell B1 to be programmed. This bias condition will cause a large current to flow though the channel region of the selected cell B1, and induce a channel hot electron injection to program cell B1 to a high threshold voltage (Vt) state. At the same time the +10V on the sector gate line 31w connects 0V from the main bit line 12w to the sub bit line 63 deselecting cell B3 from being programmed. The write bit line 12w is connected to ground level or left floating. This prevents current from flowing through the channel of the cell B3 and prevents a program operation. Main bit line 11r has approximately 1 volt applied to perform a read operation in the second sector 811, which will be described with FIG. 13.

Figure 13:
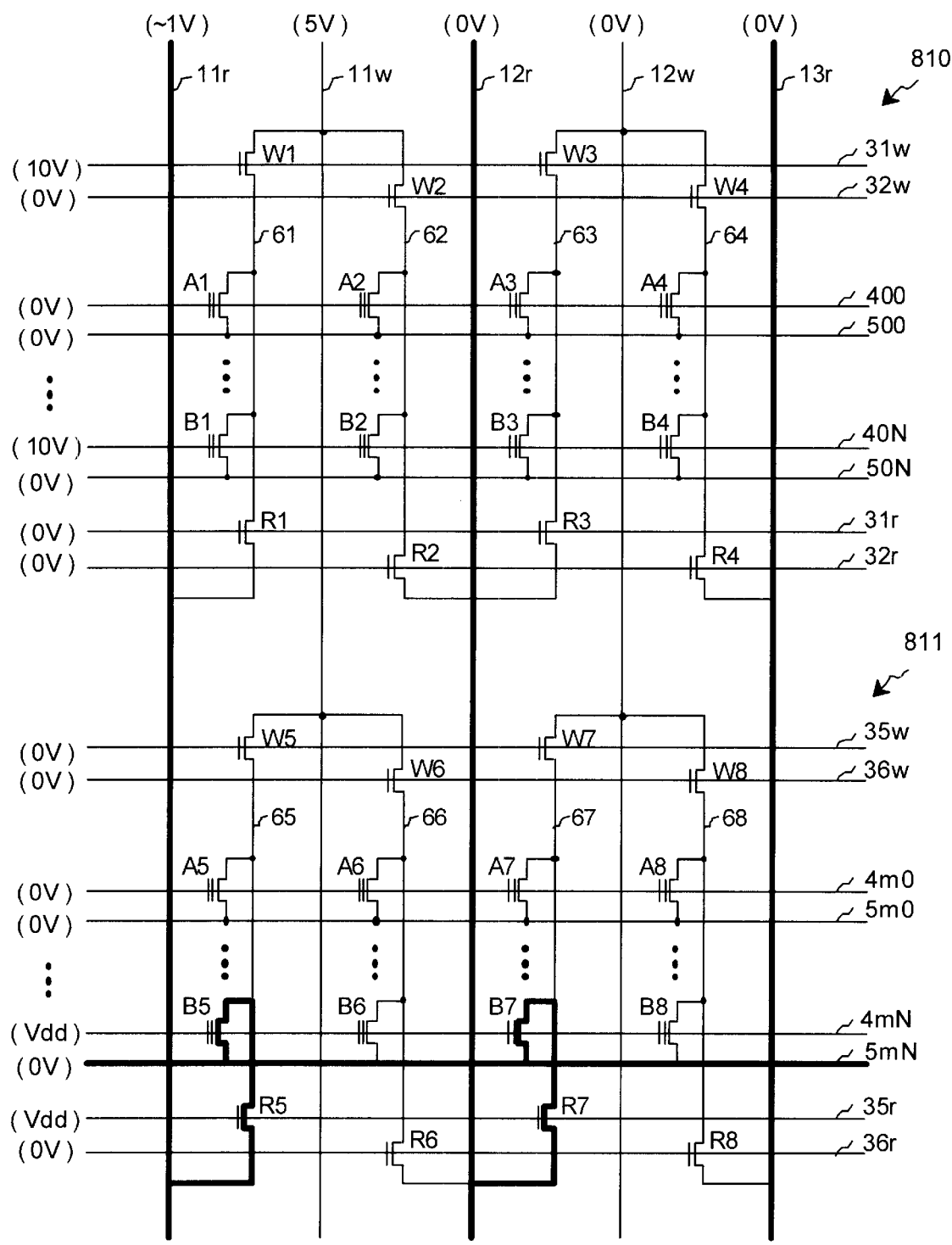
FIG. 13 is a diagram of the present invention showing the bias conditions to read the second sector of a NOR type array while programming the first sector.

FIG. 13 shows the read operation of the second sector 811 while the first sector 810 is performing a programming operation as demonstrated in FIG. 12. The bold lines indicate the voltage applied from the read bit lines 11r, 12r and 13r. In order to read the selected cell B5, the selector gate for the sector decoder R5 and R7 are turned on to connect the sub bit lines 65 and 67 to the read bit lines 11r and 12r. The read bit line 11r is connected to approximately 1 volt. The word line 4mN is connected to Vdd, and the source line 5mN is connected to ground. This bias condition will verify the Vt of the selected cell. If the Vt of the cell is in low state, there will be current flowing from the read bit line 11r to the source line 5mN. The read bit line 11r is connected to a sense amplifier circuit that will sense the current flowing in the bit line and generate a logical "1". Otherwise, the sense amplifier will sense there is no current flowing in the bit line and generate a logical "0" if the selected cell B5 is in a high Vt state. For the deselected cell B7, the read bit line 12r is applied with a ground level or left floating. This will prevent current flowing through cell B7.

Figure 14:
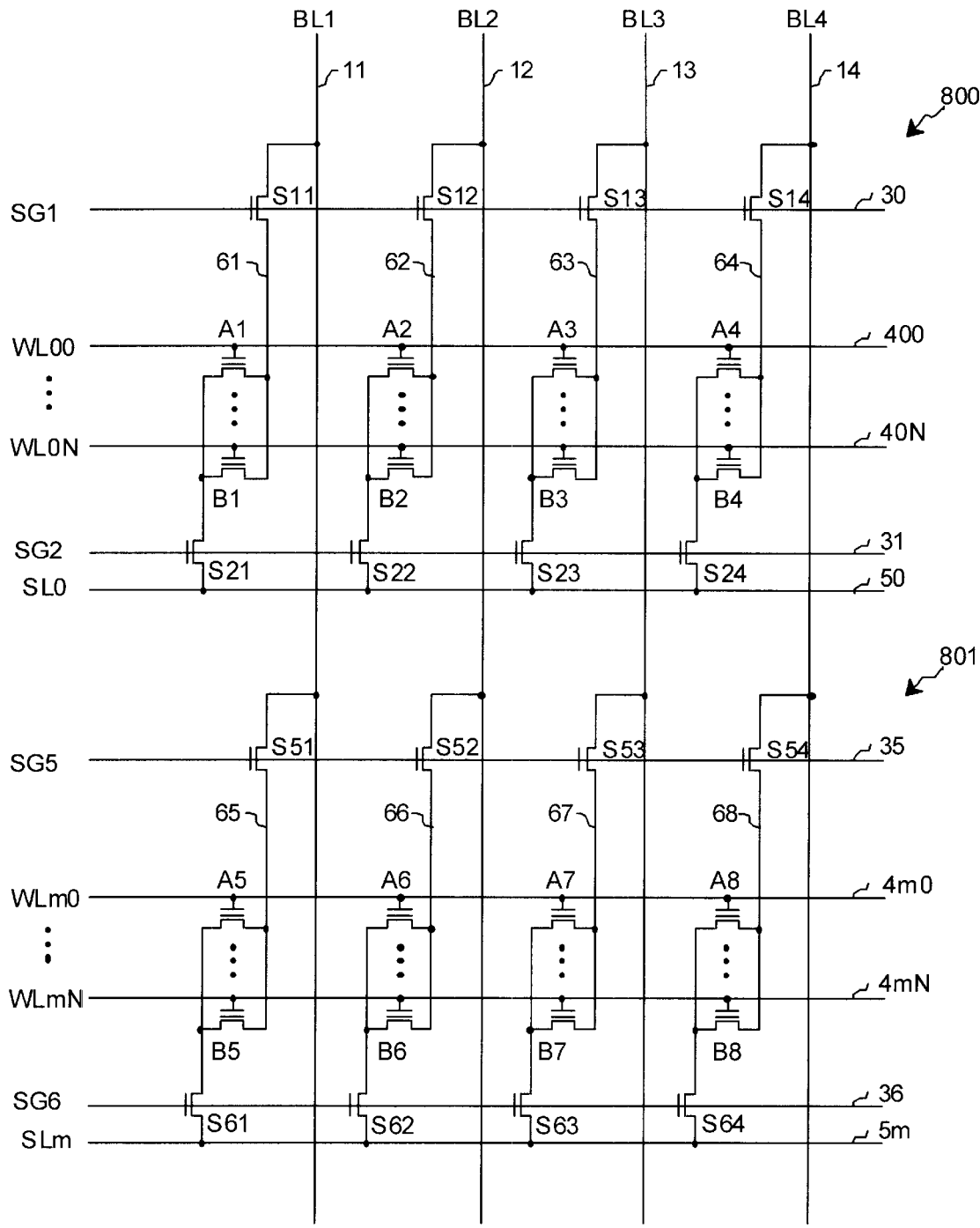
FIG. 14 is a diagram of prior art showing a conventional AND-type Flash memory array.

FIG. 14 shows the conventional AND type Flash memory array. This AND type array features a single-port sector decoder and single main bit line group, thus is only suitable for single port operation. The array is shown with two sectors 800 and 801. Contained within sector 800 are memory cells A1–A4 and B1–B4. These memory cells are connected to sub bit lines 61–64, word line WL00–WL0N (400–40N) and source line SL0 (50) through selector gates S21–S24 connected to a selector gate line SG2 (31). Selector gates S11–S14 controlled by selector gate line SG1 (30) connect the main bit lines BL1–BL4 (11–14) to the sub bit lines 61–64.

Continuing to refer to FIG. 14, contained within sector 801 are memory cells A5–A8 and B5–B8. These memory cells are connected to sub bit lines 65–68, word line WLm0–WLmN (4m0–4mN) and source line SLm (5m) through selector gates S61–S64 connected to a selector gate line SG6 (36). Selector gates S61–S64 controlled by selector gate line SG6 (36) connect the main bit lines BL1–BL4 (11–14) to the sub bit lines 65–68. This array has one selector port and can perform only one memory operation at one time.

Figure 15:
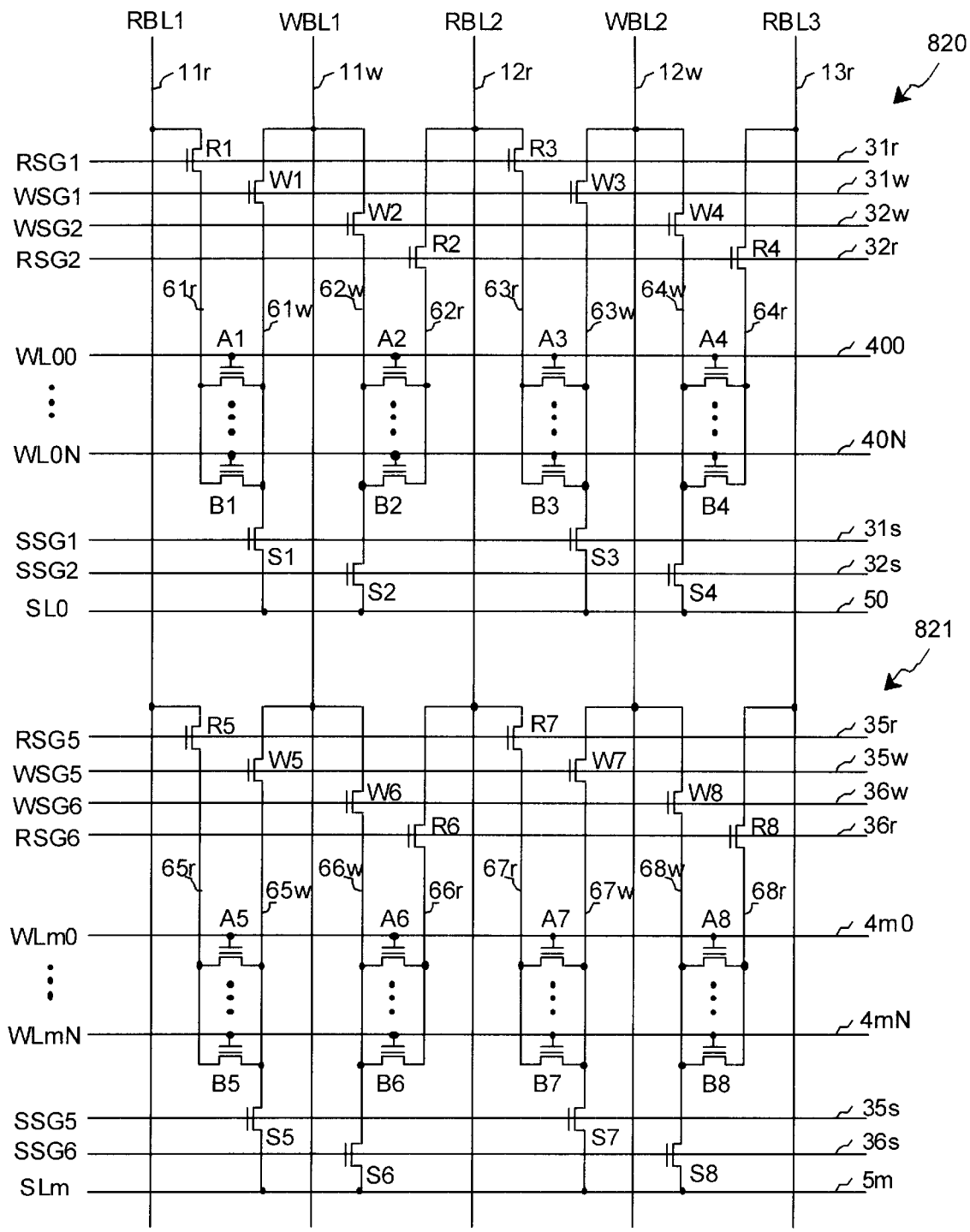
FIG. 15 is a diagram of the present invention showing the use of an AND type array structure.

Referring to FIG. 15, an example of an embodiment of the present invention is shown using an AND type array structure. There are two sectors shown, sector 820 containing memory cells A1–A4 and B1–B4, and sector 821 containing memory cells A5–A8 and B5–B8. Each of the sub bit lines 61w–64w for sector 820 are connected to write bit lines WBL1 and WBL2 (11w and 12w) through write selector gates W1–W4, and sub bit lines 61r–64r are connected to read bit lines RBL1–RBL3 (11r–13r) through read selector gates R1–R4. The write selector gates W1 and W3 are controlled by a write selector gate line WSG1 (31w), and the write selector gates W2 and W4 are controlled by a write selector gate line WSG2 (32w). The read selector gates R1 and R3 are controlled by a read selector gate line RSG1 (31r), and the read selector gates R2 and R4 are controlled by a read selector gate line RSG2 (32r). Word lines WL00–WL0N (400–40N) are connected to the gates of the one transistor flash memory cells A1–A4 and B1–B4. Source line SL0 is connected to the sources of the memory cells through source gates S1–S4. The source gates S1 and S3 are controlled by source selector gate lines SSG1 (31s), and the source gates S2 and S4 are controlled by source gate lines SSG2 (32s).

Continuing to refer to FIG. 15, each of the sub bit lines 65w–68w for sector 821 are connected to write bit lines WBL1 and WBL2 (11w and 12w) through write selector gates W1–W4, and sub bit lines 61r–64r are connected to read bit lines RBL1–RBL3 (11r–13r) through read selector gates R5–R8. The write selector gates W5 and W7 are controlled by a write selector gate line WSG5 (35w), and the write selector gates W6 and W8 are controlled by a write selector gate line WSG6 (36w). The read selector gates R5 and R7 are controlled by a read selector gate line RSG5 (35r), and the read selector gates R6 and R8 are controlled by a read selector gate line RSG6 (36r). Word lines WLm0–WLmN (4m0–4mN) are connected to the gates of the one transistor flash memory cells A5–A8 and B5–B8. Source line SLm is connected to the sources of the memory cells through source gates S5–S8. The source gates S5 and S7 are controlled by source selector gate lines SSG5 (35s), and the source gates S6 and S8 are controlled by source gate lines SSG6 (36s). The dual port architecture shown in FIG. 15 allows the different sectors 820 and 821 to be read and written simultaneously.

Figure 16:
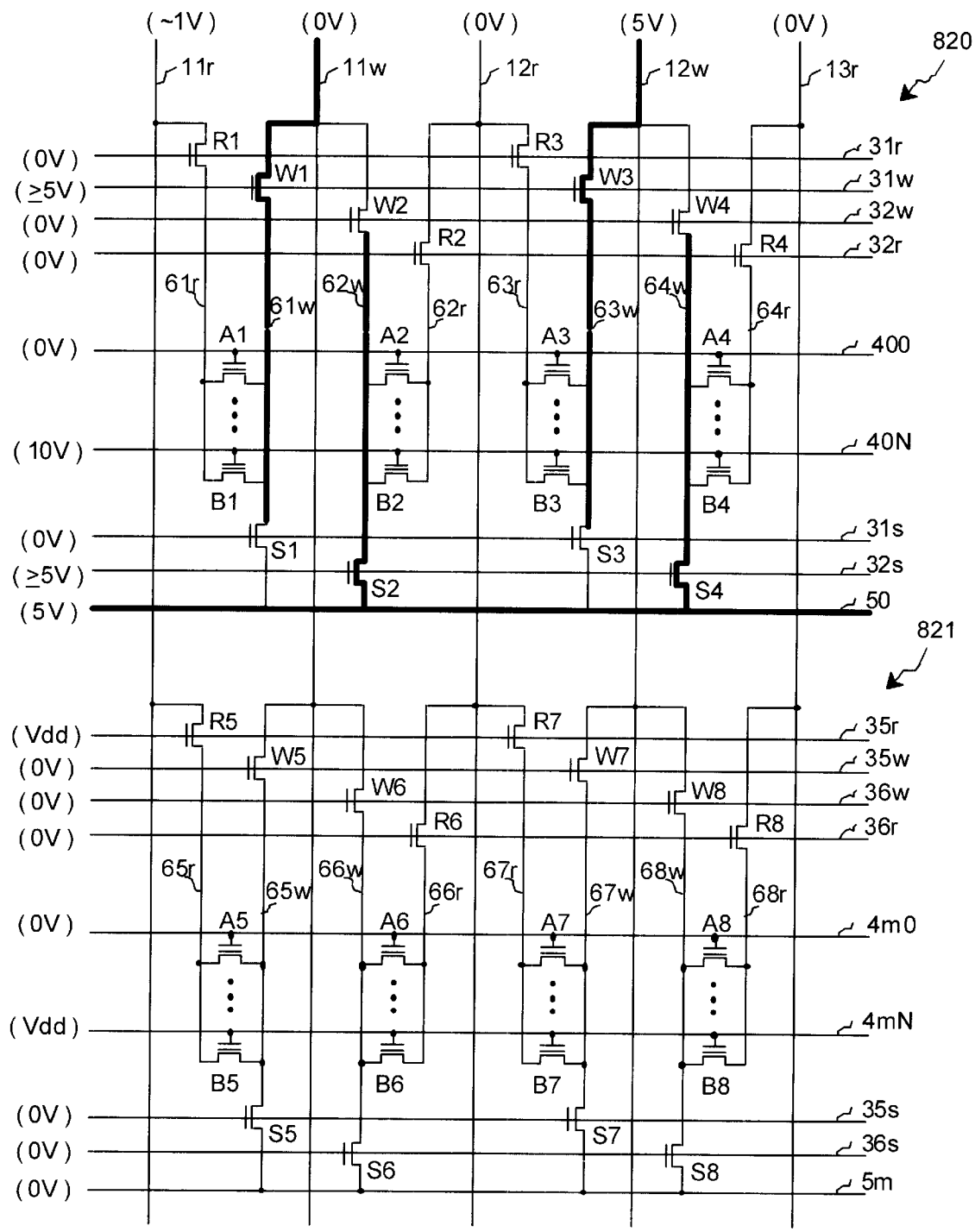
FIG. 16 is a diagram of the present invention showing the bias conditions to program a cell in the first sector of an AND type array while performing a read operation in the second sector.

FIG. 16 shows the bias conditions necessary to program cell B1 in the first sector 820 while the second sector 821) is performing a read operation, simultaneously. In order to program the selected cell B1, the write selector gates W1 and W3 are turned on by the of the sector decoder to connect the sub bit lines 61w and 63w to the write bit lines 11w and 12w. For the selected cell B1 the write bit line 61w is connected to 0V from the main write bit line 11W through the write selector gate W1. A high voltage, approximately +10V is applied to to word line 40N, and the source line is left floating by the source selector gate, which is controlled off with 0V being applied from the on the source selector gate line 31s.The bias condition will cause an electron to be injected from the bit line 61w diffusion into the floating gate of the selected cell B1 and cause the cell to have a high Vt state. This program scheme is known as Fowler-Nordheim tunneling.

Continuing to refer to FIG. 16, read bit line 12w connected to a deselected cell B3 has a high voltage of approximately 5V applied. This high voltage will reduce the voltage difference between the diffusion region of the bit line and the floating gate of the deselected cell B3 and effectively halt the cell from being programmed. For the same reason, the sub bit lines 62w and 64w are connected to a high voltage of approximately 5V through the source select gates S2 and S4 to prevent the deselected cells B2 and B4 from being programmed by high voltage of the word line 4ON.

Figure 17:
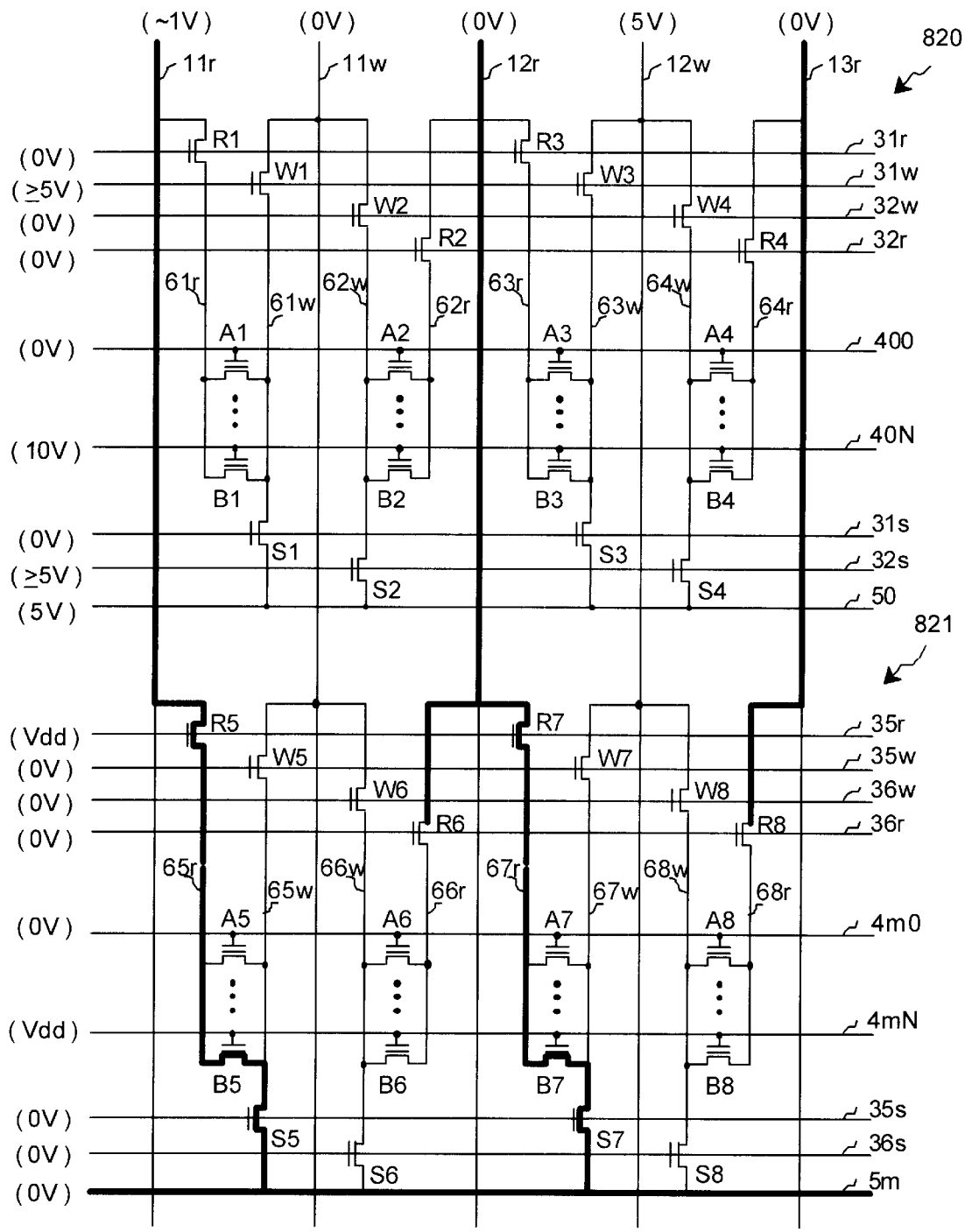
FIG. 17 is a diagram of the present invention showing the bias conditions to perform a read operation in the second sector of an AND type array while programming a cell in the first sector.

FIG. 17 shows the read condition for the second sector 821 when the first sector 820 is performing the program operation as described above with FIG. 16. To read the selected cell B5, the read select gates R5 and R7 are turned on by applying Vdd to the select gate line 35r. This will connect the selected sub bit lines 65r and 67r to the read bit lines 11r and 12r. The read bit line 11r connects approximately +1V to the read bit line 65r. The word line 4mN is connected to Vdd, and the source line 65w of the selected cell B5 is connected to ground through the source selector S5. This bias condition will cause current to flow flowing, or not flow, through the channel of the selected cell B5 depending upon whether the Vt of the cell B5 is in a low state or high state, and which will determine the data stored in the cell. For the deselected cells B6, B7, and B8, the sub bit lines are connected to ground or left floating.

Figure 18:
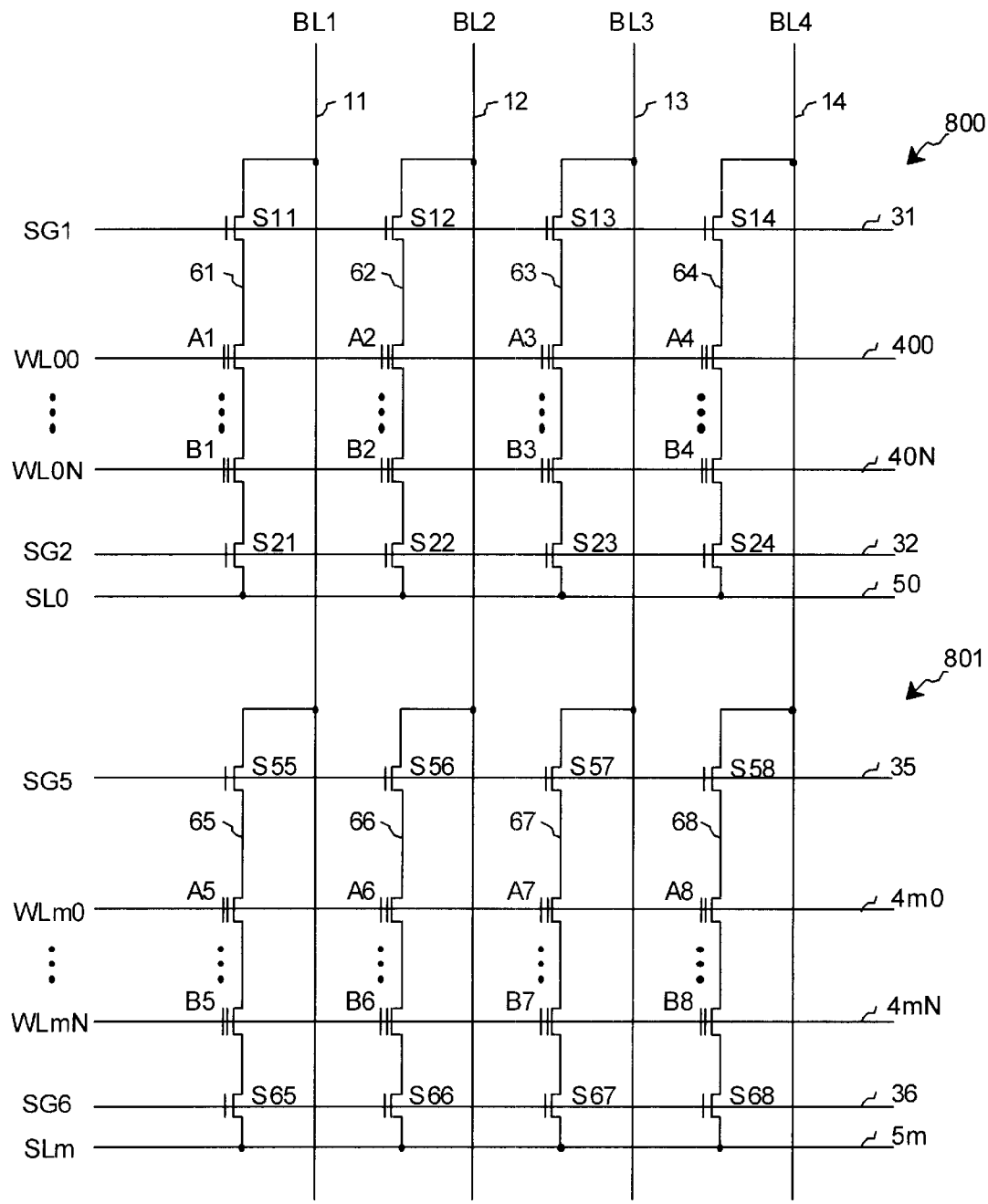
FIG. 18 is a diagram of prior art showing a conventional flash memory NAND type array.

FIG. 18 shows a NAND type conventional Flash memory array. There are two sectors shown 800 with memory cells A1–A4 and B1–B4 and 801 with memory cells A5–A8 and B5–B8. The sub bit lines 61–65 of sector 800 are connected to main bit lines BL1–B14 (11–14) through selector gates S11–S14, which are controlled by a selector gate line SG1 (31). Word lines WL00–WL0N (400–40N) are connected to the control gates of transistors of the flash memory cells A1–A4 and B1–B4, and source line SL0 (50) is connected to the memory cells through source gates S21–S24, which are controlled by source gate line SG2 (32). The conventional NAND-type array uses single port sector decoder (not shown) to decode the sub bit lines 61–64 and connect each sub bit line to one single main bit line 11–14. This architecture cannot provide more than multiple port operation.

Continuing to refer to FIG. 18, the sub bit lines 61–65 of sector 801 are connected to main bit lines BL1–B14 (11–14) through selector gates S55–S58, which are controlled by a selector gate line SG (35). Word lines WLm0–WLmN (4m0–4mN) are connected to the control gates of transistors of the flash memory cells A5–A8 and B5–B8, and source line SLm (5m) is connected to the memory cells through source gates S65–S68, which are controlled by source gate line SG6 (36). The conventional NAND-type array uses single port sector decoder (not shown) to decode the sub bit lines 65–68 and connect each sub bit line to one single main bit line 11–14.

Figure 19:
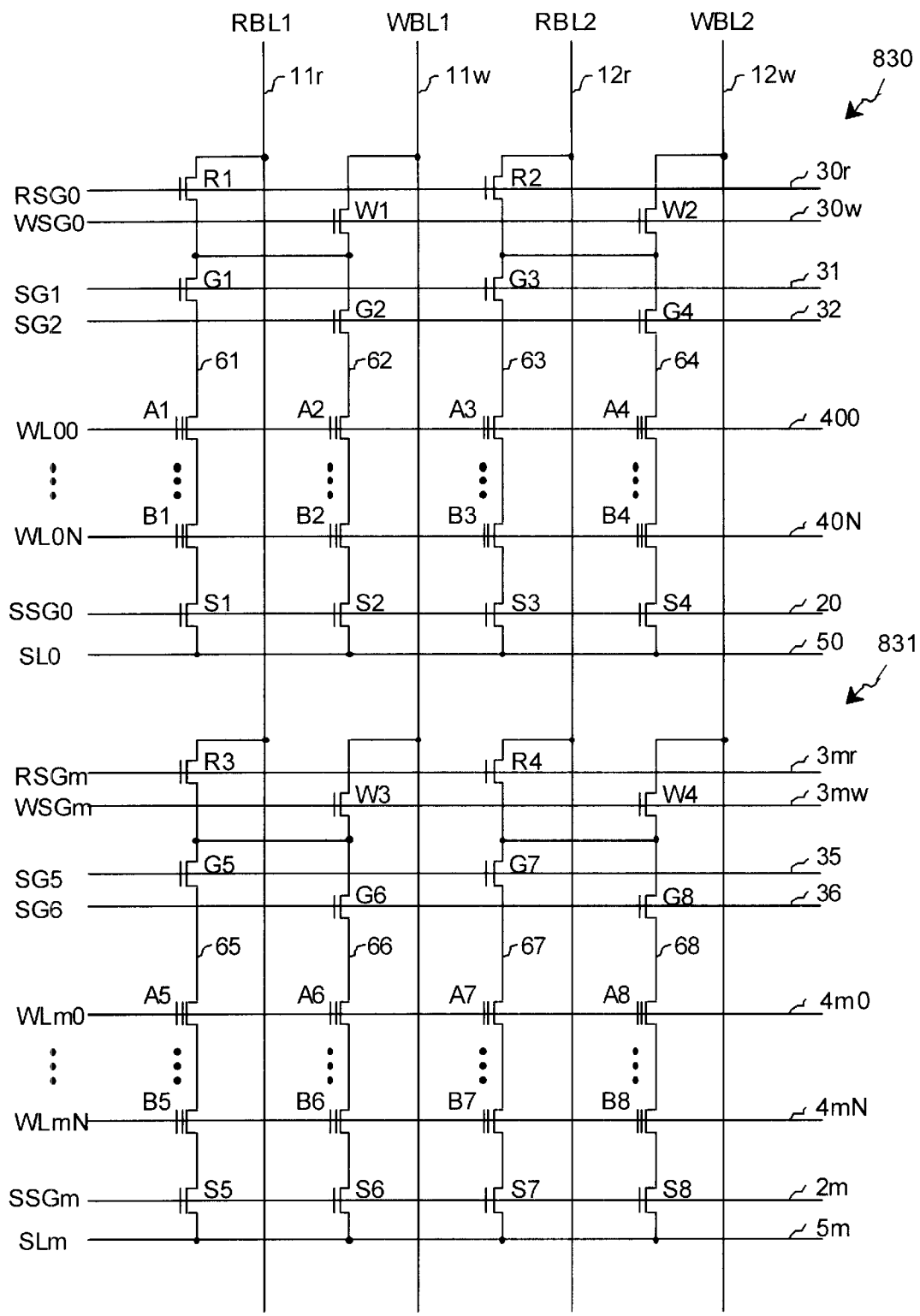
FIG. 19 is a diagram of the present invention showing the use of a NAND type array structure.

FIG. 19 shows a NAND-type array configured in accordance with the present invention. There are two sectors 830 and 831 of the array shown in FIG. 19, where, four groups of selector gates, R1 and R2, W1 and W2, G1 and G3, and G2 and G4, are used to perform the dual port decoding for every two sub bit lines, 61 and 62 and 63 and 64 of sector 830. Through the selection of the selector gates, each of the sub bit lines 61–64 can be selectively connected to the write bit lines WBL1 and WBL2 (11w and 12w) and the read bit lines RBL1 and RBL2 (11r and 12r). The sub bit lines 61–64 of the memory array of the first sector 830 are connected to the main bit lines 11r and 12r through read selector gates R1 and R2 and selector gates G1 and G3, and are connected to the main bit lines 11w and 12w through write selector gates W1 and W2 and selector gates G2 and G4. The read selector gates, R1 and R2, are controlled by a read selector gate line RSG0 (30r). The write selector gates, W1 and W2, are controlled by a read selector gate line WSG0 (30w). The selector gates G1 and G3 are controlled by a selector gate control line SG1 (31), and the selector gates G2 and G4 are controlled by a selector gate control line SG2 (32). Word lines WL00–WL0N (400–40N) are connected to the memory cells A1–A4 and B1–B4, and the source line SL0 (50) is connected to the source of the bottom memory cells B1–B4 through source gates S1–S4 controlled by a source selector gate line SSG0 (20).

Continuing to refer to FIG. 19, four groups of selector gates, R3 and R4, W3 and W4, G5 and G7, and G6 and G8, are used to perform the dual port decoding for every two sub bit lines, 65 and 66 and 67 and 68 of sector 831. Through the selection of the selector gates, each of the sub bit lines 65–68 can be selectively connected to the write bit lines WBL1 and WBL2 (11w and 12w) and the read bit lines RBL1 and RBL2 (11r and 12r). The sub bit lines 65–68 of the memory array of the second sector 831 are connected to the main bit lines 11r and 12r through read selector gates R3 and R4 and selector gates G5 and G7, and are connected to the main bit lines 11w and 12w through write selector gates W3 and W4 and selector gates G6 and G8. The read selector gates, R3 and R4, are controlled by a read selector gate line RSGm (3mr). The write selector gates, W3 and W4, are controlled by a read selector gate line WSGm (3mw). The selector gates G5 and G7 are controlled by a selector gate control line SG5 (35), and the selector gates G6 and G8 are controlled by a selector gate control line SG6 (36). Word lines WLm0–WLmN (4m0–4mN) are connected to the memory cells A5–A8 and B5–B8, and the source line SLm (5m) is connected to the source of the bottom memory cells B5–B8 through source gates S5–S8 controlled by a source selector gate line SSGm (2m). The array configuration shown in FIG. 19 is capable of simultaneous memory operations.

Figure 20:
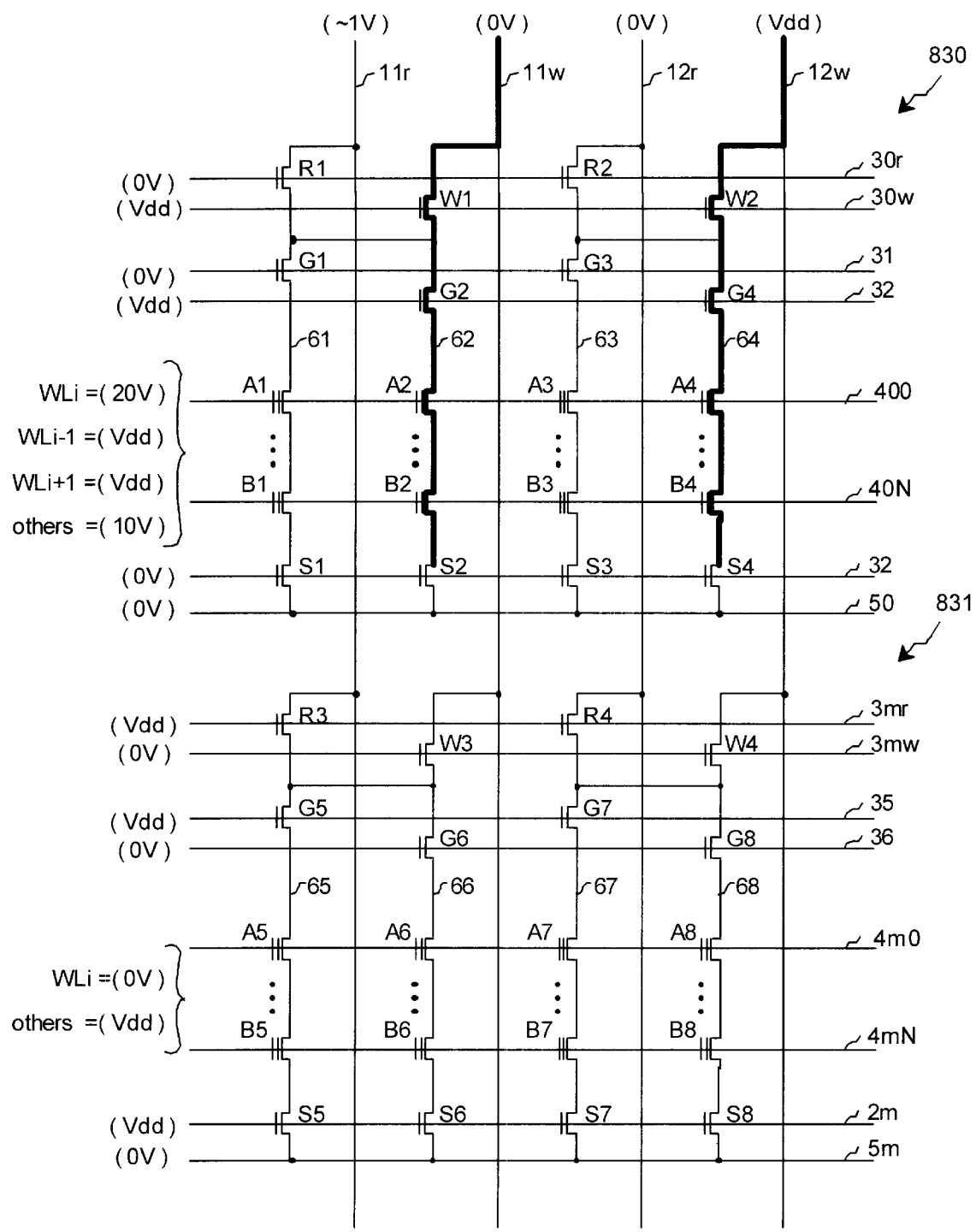
FIG. 20 is a diagram of the present invention showing the bias conditions to program a cell in the first sector of a NAND type array while performing a read operation in the second sector.

In FIG. 20 is shown the voltages necessary to program memory cell B2 in sector 830. The bold lines show the voltage paths applied from the write bit lines 11w and 12w. When the write selectors gates W1 and W2, and the selector gates G2 and G4 are turned on by applying Vdd to the write selector gate line 30w and the selector gate line 32, the voltage from the write bit lines 11w and 12w are applied to the sub bit lines 62 and 64. The program conditions for the NAND type array include all the word lines connected to the sector. The selected word line WLi is applied with high voltage such as 20 volts. The two adjacent word lines WLi+1 and WLi−1) of the selected word line are applied with low voltage such as Vdd, and all the other word lines are applied with high voltage such as 10 volts. This bias condition will generate an effect called "self channel boosting" that can effectively reduce the disturb condition caused by the word line connected to the deselected cells. For example, if the cell B4 is deselected, the read bit line 12w corresponding to the cell B4 is coupled to Vdd. This will shut off the selector gates W2 and G4, and cause the sub bit line 64 of the deselected cell B4 to become floating. When to the sub bit line 64 is in floating condition, the channel region of the deselected cell B4 can be coupled by the word line high voltage to at least approximately 10 volts. This channel voltage then can effectively cancel the disturb condition from the word line high voltage around 20 volts. For the selected cell B2, the write bit line 11w is coupled to ground. This voltage will turn on the select gates W1 and G2, and pass to the channel region of the selected cell B2. The selected cell B2 will then be programmed by the Fowler-Nordheim tunneling, as a result of the high differential voltage between the channel region and the floating gate of the selected cell B2. It should be noted that during this operation, the selector gates G1 and G3 of the deselected sub bit lines 61 and 63 are turned off. Thus, the self-channel boosting phenomenon will also happen to the deselected cells B1 and B3 to prevent them from being disturbed by the word line voltage.

Figure 21:
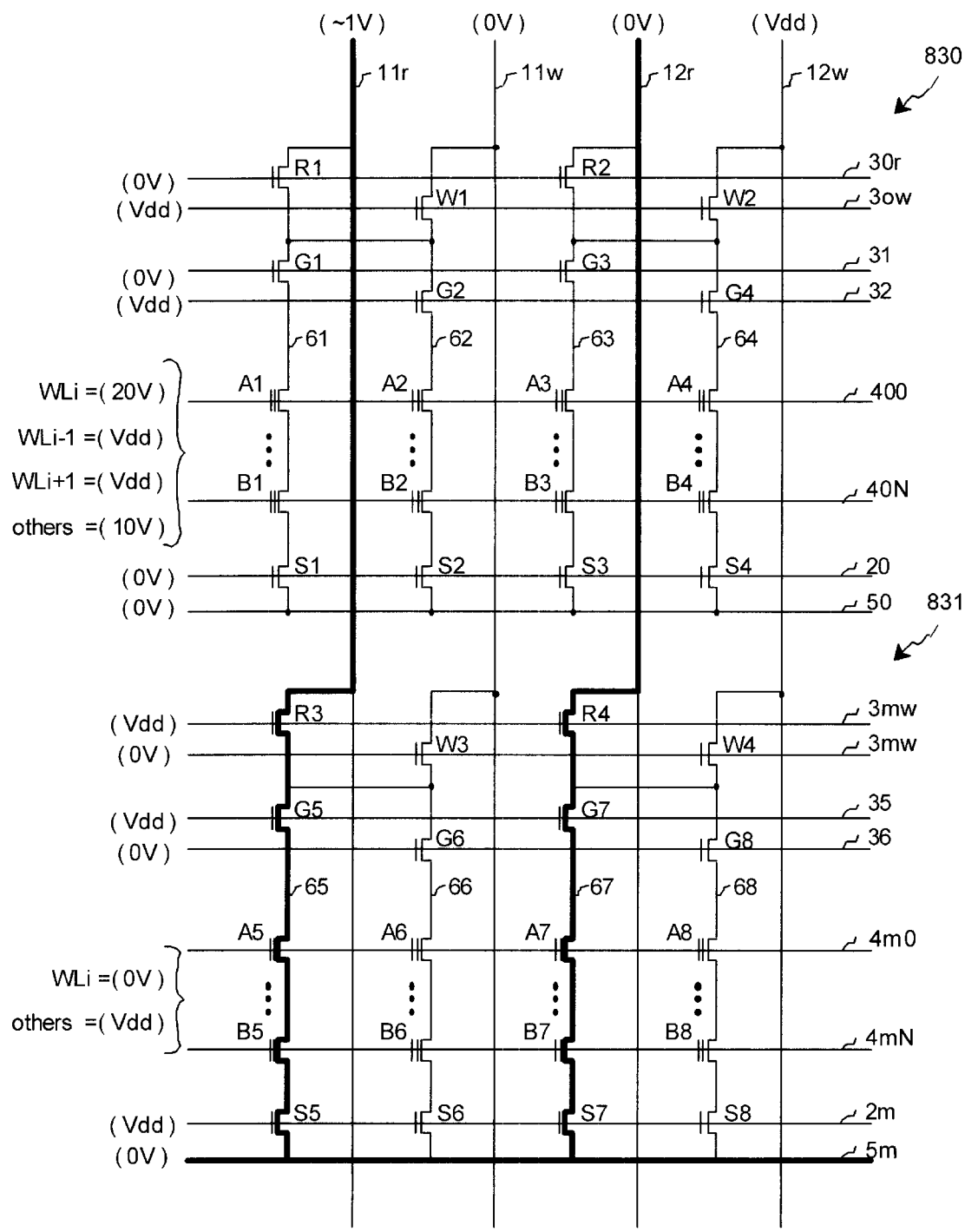
FIG. 21 is a diagram of the present invention showing the bias conditions to perform a read operation in the second sector of a NAND type array while programming a cell in the first sector.

FIG. 21 shows the read condition of the second sector 831 while the first sector 830) is simultaneously in a program operation. To read the selected cell B5, the select gates R3, R4, G5, and G7 are turned on to connect the sub bit lines 65 and 67 to the read bit lines 11r and 12r. The selected read bit line 11r is coupled with approximately 1 volt, while the deselected read bit line 12r is grounded or floating. All of the deselected word lines in the selected sector 831 are coupled to Vdd and the selected word line is coupled with ground. This will allow the current to flow from the read bit line 11r through all the deselected cells to the selected cell B5. If the Vt of the selected cell B5 is lower than zero volts, the channel of the cell B5 will be turned on by the grounded word line, which can cause current flowing from the read bit line 11r to the source line 5m. Otherwise, the channel of the selected cell B5 will be shut off and stop the current flowing on the read bit line 11r. The sense amplifier connected to the read bit line 11r will sense the current flowing and determine the data of the cell B5.

Three examples of the embodiments of the present invention have been shown using NOR, AND, and NAND type array structures. It should be noted that the example array architectures which have been shown are not the only ways to realize the basic concept of the invention. Using any other array architecture or modified array architecture from the examples but still using the disclosed multiple-port concept, multiple-port architecture, or multiple-port operation will remain in the scope of the present invention. Moreover, although the examples in this disclosure of the present invention do not show the array using of a multiple level decoder, such as the tree decoder, the concept of the present invention can be applied to those applications as well. For example, referring to FIG. 3 for the basic dual port array architecture of the present invention. Although, the example shows each sector 160a–160k is decoded by a sector decoder 150a–150k, it is not necessary to use only one level of the sector decoder for each sector.

Alternatively, each sector can also contain several levels of sub bit line decoders. Also, outside of the sectors, multiple sectors can be grouped together and multiple levels of decoders can be added to further decode the main bit lines. This arrangement would allow the sector size for the simultaneous operation to be different from the sector size for the erase and write operation. For example, for a typical NOR type flash memory array, the typical sector size for the erase operation is approximately 64 K bytes that can be formed by 512 word lines and 1,024 bit lines. However, for the AND type or NAND type flash memory array, the erase sector size typically contains less number of word lines such as 32 word lines. For this small number of word lines, it may not be suitable or necessary to provide each erase sector with the flexibility of being simultaneously read and write. It may need to have a simultaneous read and write function for every 512 word lines rather than 32 word lines, depending on the application. In this case, the sector can be partitioned to use a two level decoder scheme in which the first decoder level uses the conventional sector decoder for every 32 word lines to form the erase sector.

In the second decoder level the multiple port sector decoder scheme would be used for every 512 word lines, or every 16 erase sectors, to provide the capability of multiple simultaneous operations. By using a hierarchical decoder scheme, the array architecture can provide a high degree of flexibility in the sector size in terms of the erase disturb concerns and simultaneous operation. Various types of the hierarchical decoder schemes can be used according to the concept of the present invention and will still remain in the scope of the invention. By using the disclosed approach of the present invention, the array architectures can become very flexible and can be optimized and suitable for many kinds of applications.

While the invention has been particularly shown and described with reference to preferred embodiments thereof, it will be understood by those skilled in the art that various changes in form and details may be made without departing from the spirit and scope of the invention.

What is claimed is:

1. A memory for simultaneous memory operations, comprising:
   a) a memory array,
   b) a plurality of multi-port sector decoders,
   c) a plurality of groups of main bit lines,
   d) said memory array organized into a plurality of sectors, each of said sectors comprising a plurality of columns of memory cells connected to a plurality of sub bit lines,
   e) a sector decoder of said plurality of multi-port sector decoders coupled to each sector of said plurality of sectors and selecting which group of main bit lines to couple to said sub bit lines.

2. The memory of claim 1, wherein said multi-port sector decoders have a plurality of input ports and a plurality of output ports to connect a plurality of main bit lines to a plurality of sub bit lines in said sectors.

3. The memory of claim 1, further comprising word lines and source lines coupled to said memory cells to select and condition said memory cells for a read operation or a write operation.

4. The memory of claim 1, wherein said memory array is a nonvolatile flash memory array and further comprises word lines and source lines coupled to said memory cells to select and condition said memory cells for a read operation or a write operation.

5. The memory of claim 4, wherein said memory array is a NOR type flash memory array.

6. The memory of claim 4, wherein said memory array is an AND type flash memory array.

7. The memory of claim 4, wherein said memory array is a NAND type flash memory array.

8. The memory of claim 4, wherein said memory array is configured from any one of a variety of array architectures, comprising NOR, OR, NAND, AND, Dual-String and DINOR.

9. The memory of claim 4, wherein said memory cells are formed from any one of a variety of cell structures, comprising ETOX, FLOTOX, EPROM, EEPROM, Split-Gate and PMOS.

10. The memory of claim 4, wherein said sector decoder is a $2^M$ type decoder where $2^M$ defines the number of said sub bit lines that are selected to be coupled by said sector decoder to said main bit line.

11. The memory of claim 4, wherein said sector decoder is a hierarchical type decoder with a plurality of decoding levels.

* * * * *